United States Patent
Yoon et al.

(10) Patent No.: US 10,945,343 B2
(45) Date of Patent: Mar. 9, 2021

(54) ELECTRONIC APPARATUS

(71) Applicant: Samsung Display Co., Ltd., Yongin-si (KR)

(72) Inventors: Hyoyul Yoon, Seoul (KR); MinGu Kim, Seoul (KR); Hyunsuk Nam, Seoul (KR); Kyoungah Lee, Seoul (KR); Dongjin Park, Seongnam-si (KR); Sangwol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/775,763

(22) Filed: Jan. 29, 2020

(65) Prior Publication Data
US 2020/0260597 A1    Aug. 13, 2020

(30) Foreign Application Priority Data
Feb. 12, 2019    (KR) ........................ 10-2019-0016264

(51) Int. Cl.
*H05K 5/00* (2006.01)
*H05K 5/02* (2006.01)
*H01L 51/00* (2006.01)
*H01L 27/32* (2006.01)

(52) U.S. Cl.
CPC ....... *H05K 5/0017* (2013.01); *H01L 51/0097* (2013.01); *H05K 5/0226* (2013.01); *H01L 27/3244* (2013.01); *H01L 2251/5338* (2013.01)

(58) Field of Classification Search
CPC .............. H05K 5/0017; H05K 5/0226; H01L 51/0097; H01L 2251/5338; H01L 27/3244; G09F 9/301; G06F 1/1637
See application file for complete search history.

(56) References Cited

U.S. PATENT DOCUMENTS

| | | | |
|---|---|---|---|
| 7,706,139 B2 * | 4/2010 | Kim | G06F 1/1601 361/679.21 |
| 9,048,443 B2 | 6/2015 | Namkung et al. | |
| 9,196,848 B2 | 11/2015 | Namkung et al. | |

(Continued)

FOREIGN PATENT DOCUMENTS

| JP | 2003-243778 A | 8/2003 |
|---|---|---|
| KR | 10-2014-0085956 A | 7/2014 |

(Continued)

*Primary Examiner* — Abhishek M Rathod
(74) *Attorney, Agent, or Firm* — Lewis Roca Rothgerber Christie LLP

(57) ABSTRACT

An electronic apparatus includes a display panel including a folding portion overlapping with a folding axis, a first non-folding portion and a second non-folding portion, a support unit including a first support portion arranged under the first non-folding portion and a second support portion arranged under the second non-folding portion, an impact absorbing member interposed between the display panel and the support unit and coupled to the display panel, an adhesive member coupling the impact absorbing member to the support unit, a receiving portion defined in at least one of the first support portion or the second support portion, and a protrusion connected to the impact absorbing member and received in the receiving portion. A planar area of the protrusion is less than a planar area of the receiving portion.

20 Claims, 20 Drawing Sheets

(56) References Cited

U.S. PATENT DOCUMENTS

| | | |
|---|---|---|
| 9,214,640 B2 | 12/2015 | Lee et al. |
| 9,324,959 B2 | 4/2016 | Namkung et al. |
| 9,419,065 B2 | 8/2016 | Degner et al. |
| 9,681,556 B2 * | 6/2017 | Llapitan ............... H05K 7/1061 |
| 9,939,846 B2 | 4/2018 | Namkung et al. |
| 10,191,516 B2 | 1/2019 | Jang et al. |
| 10,541,373 B2 * | 1/2020 | Park .................... H01L 51/0097 |
| 2016/0054613 A1 * | 2/2016 | Lee ................... G02F 1/133308 |
| | | 362/97.2 |
| 2016/0238895 A1 * | 8/2016 | Choi ................ G02F 1/133608 |
| 2017/0042047 A1 | 2/2017 | Oh |
| 2017/0060188 A1 | 3/2017 | Han et al. |
| 2017/0075464 A1 | 3/2017 | Ahn |
| 2017/0325340 A1 * | 11/2017 | Schafer ................ H05K 5/0017 |
| 2020/0227677 A1 * | 7/2020 | Park .......................... B32B 7/06 |

FOREIGN PATENT DOCUMENTS

| | | |
|---|---|---|
| KR | 10-2015-0007632 A | 1/2015 |
| KR | 10-2015-0094989 A | 8/2015 |
| KR | 10-2017-0026021 A | 3/2017 |
| KR | 10-2017-0063344 A | 6/2017 |
| KR | 10-2018-0062273 A | 6/2018 |

* cited by examiner

ELECTRONIC APPARATUS

CROSS-REFERENCE TO RELATED APPLICATION

This application claims priority to and the benefit of Korean Patent Application No. 10-2019-0016264, filed on Feb. 12, 2019, the entire content of which is hereby incorporated by reference.

BACKGROUND

1. Field

The present disclosure herein relates to an electronic apparatus, and, more particularly, to an electronic apparatus with improved reliability.

2. Description of the Related Art

An electronic apparatus may provide an electrically activated active area to a user. A user may receive information through an image provided in the active area and/or may provide an input signal to the active area to control the electronic apparatus.

Typically, an electronic apparatus may display information and/or sense an external input in a designated screen. Recently, electronic apparatuses including flexible display panels and/or flexible touch panels have been developed. Unlike a flat panel, flexible panels may be foldable, rollable, or bendable like a piece of paper. The flexible panels of which shapes can be variously changed may be carried regardless of a screen size, thereby improving user convenience.

SUMMARY

Aspects of embodiments of the present disclosure are directed toward a foldable electronic apparatus with improved reliability.

In an embodiment of the inventive concepts, an electronic apparatus includes a display panel including a folding portion overlapping with a folding axis of the display panel, a first non-folding portion, and a second non-folding portion, the first and second non-folding portions being spaced apart from each other with the folding portion interposed therebetween, a support unit including a first support portion overlapping with the first non-folding portion and a second support portion overlapping with the second non-folding portion and spaced apart from the first support portion, an impact absorbing member interposed between the display panel and the support unit and coupled to the display panel, an adhesive member interposed between the impact absorbing member and the support unit to couple the impact absorbing member and the support unit to each other, a receiving portion defined in at least one of the first support portion or the second support portion, and a protrusion connected to the impact absorbing member and arranged in the receiving portion. A planar area of the protrusion is less than a planar area of the receiving portion.

In an embodiment, the adhesive member may include a pressure sensitive adhesive (PSA).

In an embodiment, the protrusion may have a circular shape when viewed in a plan view.

In an embodiment, the protrusion may be spaced apart from an inner sidewall of the receiving portion.

In an embodiment, the protrusion may have a bar shape extending in one direction when viewed in a plan view.

In an embodiment, the protrusion may be in contact with an inner sidewall of the receiving portion in the one direction and may be spaced apart from an inner sidewall of the receiving portion in another direction crossing or intersecting the one direction.

In an embodiment, the electronic apparatus may further include an elastic member arranged in the receiving portion and interposed between the protrusion and an inner sidewall of the receiving portion.

In an embodiment, the elastic member may have an elastic force higher than that of the protrusion.

In an embodiment, the protrusion may be connected directly to the impact absorbing member.

In an embodiment, the protrusion may penetrate the adhesive member.

In an embodiment, the support unit may further include a hinge portion overlapping with the folding portion and connecting the first support portion and the second support portion. The first support portion and the second support portion may be foldable about the hinge portion.

In an embodiment, the adhesive member may be spaced apart from the hinge portion when viewed in a plan view.

In an embodiment, the impact absorbing member may be lower in elastic modulus than that of the support unit.

In an embodiment of the inventive concepts, an electronic apparatus includes a display panel including a folding portion overlapping with a folding axis of the display panel, a first non-folding portion, and a second non-folding portion, the first and second non-folding portions being spaced apart from each other with the folding portion interposed therebetween and connected to the folding portion, a support unit including a first support portion arranged under the first non-folding portion and a second support portion arranged under the second non-folding portion and spaced apart from the first support portion, an impact absorbing member interposed between the display panel and the support unit and coupled to the display panel, an adhesive member interposed between the impact absorbing member and the support unit to couple the impact absorbing member and the support unit to each other, and a guide portion arranged on each of the first and second support portions. The guide portion is spaced apart from the display panel and the adhesive member when viewed in a plan view.

In an embodiment, the guide portion may have a bar shape facing an edge of the display panel and extending in a direction parallel to the edge, when viewed in a plan view.

In an embodiment, the guide portion may have a shape which is spaced apart from a vertex of the display panel and is bent to surround two edges of the display panel, when viewed in a plan view.

In an embodiment, the guide portion may be provided in plurality, and the guide portions may be arranged along edges of the display panel.

In an embodiment, the support unit may further include a hinge portion overlapping with the folding portion and connecting the first support portion and the second support portion. The adhesive member may not overlap with the hinge portion when viewed in a plan view.

In an embodiment, the adhesive member may include a pressure sensitive adhesive (PSA).

In an embodiment, the impact absorbing member may be lower in elastic modulus than that of the support unit.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION

Figure 1A:
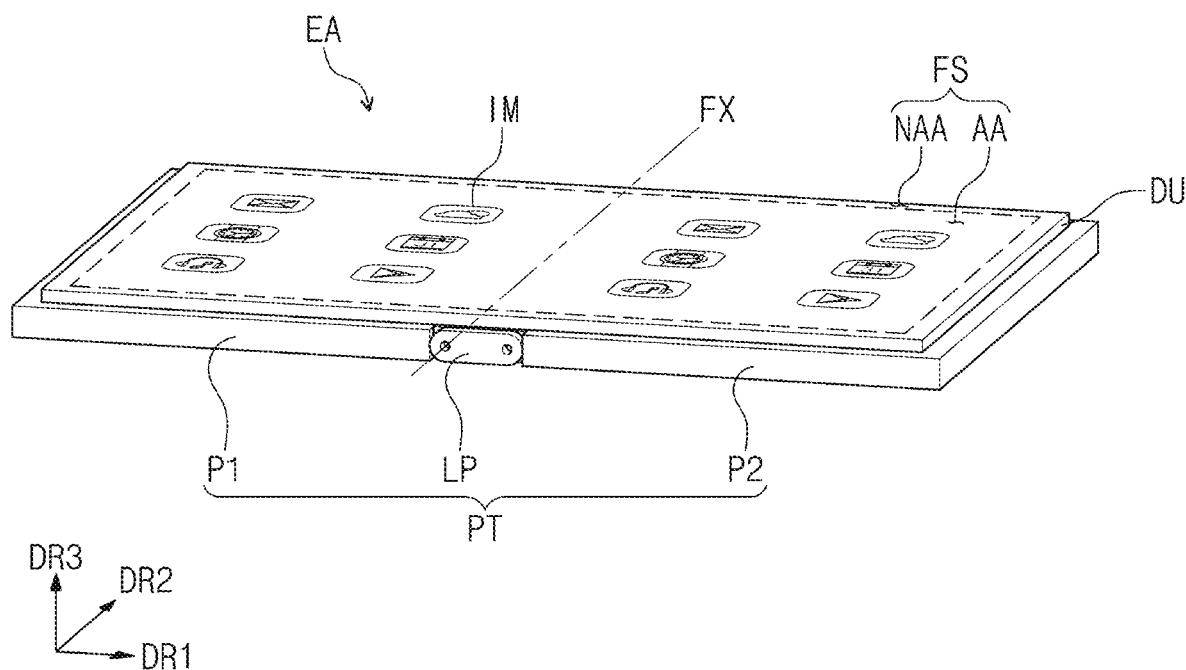
FIGS. 1A and 1B are perspective views illustrating an electronic apparatus according to an embodiment of the inventive concepts.

The inventive concepts now will be described more fully hereinafter with reference to the accompanying drawings, in which various embodiments are shown. The inventive concepts may, however, be embodied in many different forms, and should not be construed as limited to the embodiments set forth herein. Rather, these embodiments are provided so that this disclosure will be thorough and complete, and will fully convey the scopes of the inventive concepts to those skilled in the art. Like reference numerals refer to like elements throughout.

It will be understood that when an element such as a layer, region, or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." It will be further understood that the terms "comprises" and/or "comprising," or "includes" and/or "including," when used in this specification specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc., may be used herein to describe various elements, components, regions, layers, and/or sections, these elements, components, regions, layers, and/or sections should not be limited by these terms. These terms are used only to distinguish one element, component, region, layer, or section from another element, component, region, layer, or section. Thus, a first element, component, region, layer, or section discussed below could be termed a second element, component, region, layer, or section without departing from the teachings herein. Further, the use of "may" when describing embodiments of the inventive concept refers to "one or more embodiments of the inventive concept." Also, the term "exemplary" is intended to refer to an example or illustration.

It will be understood that when an element or layer is referred to as being "on," "connected to," "coupled to," or "adjacent to" another element or layer, it can be directly on, connected to, coupled to, or adjacent to the other element or layer, or one or more intervening elements or layers may be present. In contrast, when an element or layer is referred to as being "directly on," "directly connected to," "directly coupled to," or "immediately adjacent to" another element or layer, there are no intervening elements or layers present.

As used herein, the terms "substantially," "about," "approximately," and similar terms are used as terms of approximation and not as terms of degree, and are intended to account for the inherent deviations in measured or calculated values that would be recognized by those of ordinary skill in the art. Further, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the inventive concepts will be described in more detail with reference to the accompanying drawings.

Figure 1B:
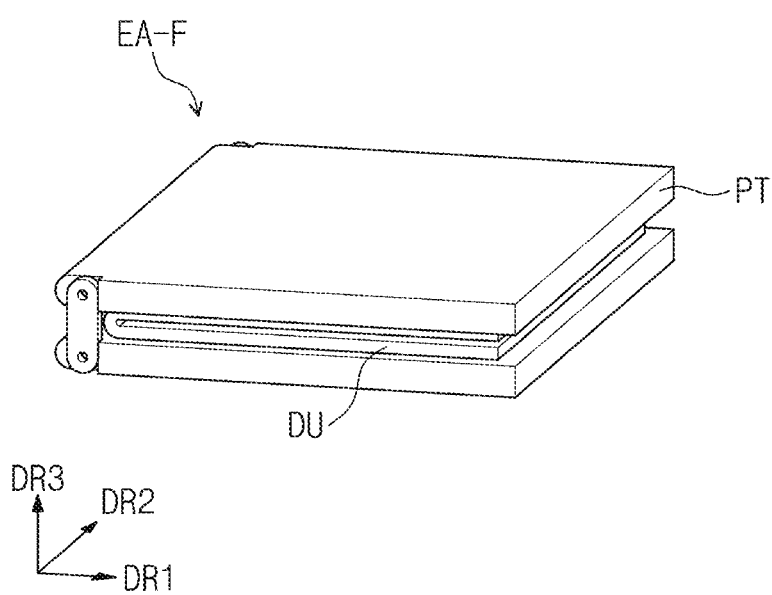

FIGS. 1A and 1B are perspective views illustrating an electronic apparatus according to an embodiment of the inventive concepts. An electronic apparatus EA may display an image IM in response to an electrical signal. The electronic apparatus EA may include a display unit DU and a support unit PT.

The display unit DU may include a front surface FS on which the image IM is displayed. The front surface FS may include an active area AA and a peripheral area NAA. The active area AA may be an area in which light emitting elements activated in response to electrical signals are disposed, and the image IM may be displayed in the active area AA. The peripheral area NAA may be adjacent to the active area AA. Various kinds of signal lines and/or driving elements for providing electrical signals transmitted to the active area AA may be disposed in the peripheral area NAA.

The support unit PT may be coupled to the display unit DU to support the display unit DU. The support unit PT may include a first support portion P1, a second support portion P2, and a hinge portion LP. The first support portion P1 may be coupled to a rear surface of a portion of the display unit DU to support the display unit DU. The second support portion P2 may be coupled to a rear surface of another portion of the display unit DU to support the display unit DU.

The hinge portion LP may be disposed between the first support portion P1 and the second support portion P2 and may connect the first and second support portions P1 and P2 to each other. The hinge portion LP may support a remaining portion of the display unit DU.

Also, the electronic apparatus EA may be folded or unfolded about a folding axis FX, as illustrated in FIGS. 1A and 1B. In the present embodiment, for the purpose of ease and convenience in description and illustration, the electronic apparatus EA in an unfolded state is illustrated in FIG. 1A and an electronic apparatus EA-F in a folded state is illustrated in FIG. 1B.

The folding axis FX may extend in a second direction DR2. In the electronic apparatus in the unfolded state, the folding axis FX may be defined at a position overlapping with the hinge portion LP of the support unit PT in a plan view. In the support unit PT, the first support portion P1 and the second support portion P2 may be fluidly coupled to the hinge portion LP. In more detail, the first support portion P1 and the second support portion P2 may be rotatable about the hinge portion LP.

In one embodiment, the display unit DU should have flexibility. The display unit DU may be folded or unfolded about the folding axis FX due to the flexibility. When the electronic apparatus EA is unfolded or folded, the shape of the display unit DU may be deformed by substantially the support unit PT.

Figure 2A:
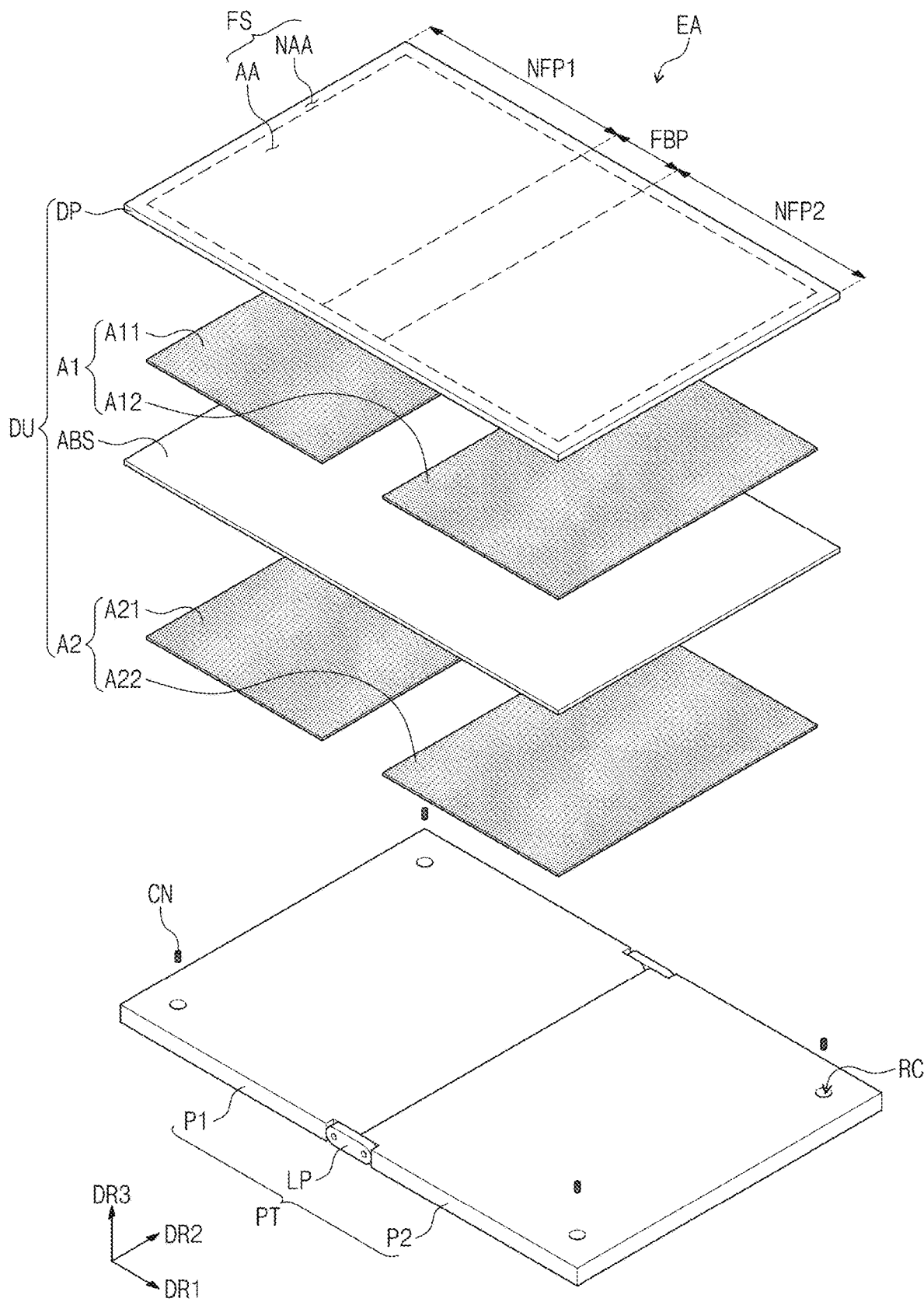
FIG. 2A is an exploded perspective view illustrating an electronic apparatus according to an embodiment of the inventive concepts.
Figure 2B:
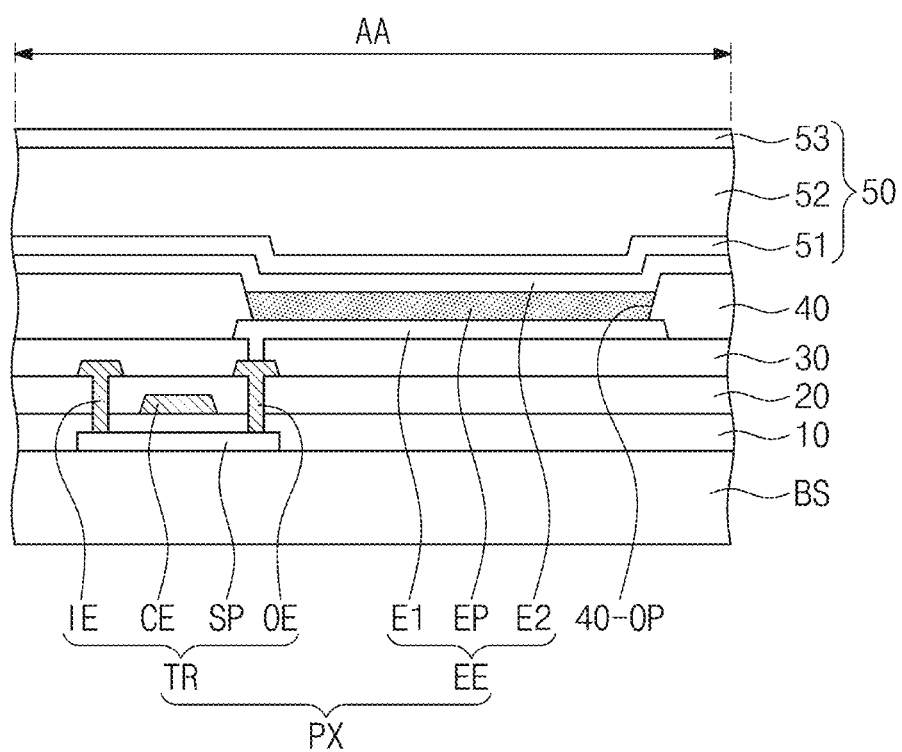
FIG. 2B is a cross-sectional view illustrating some components of FIG. 2A.
Figure 3A:
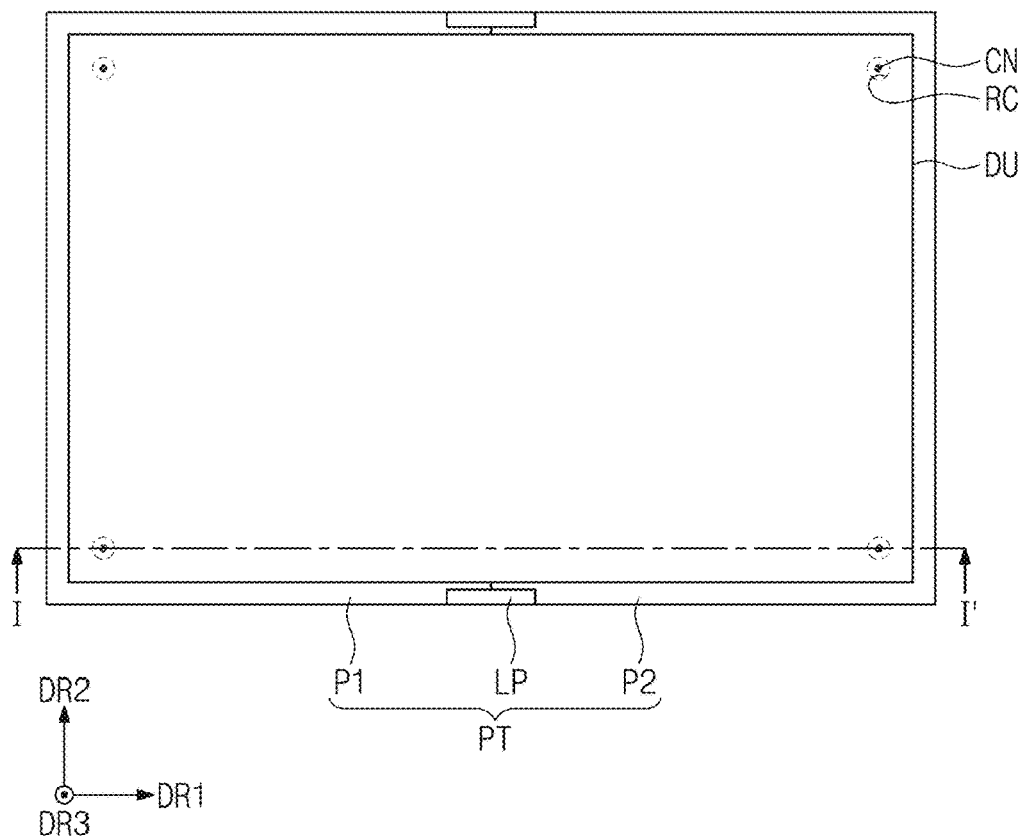
FIG. 3A is a plan view illustrating an assembled electronic apparatus according to an embodiment of the inventive concepts.
Figure 3B:
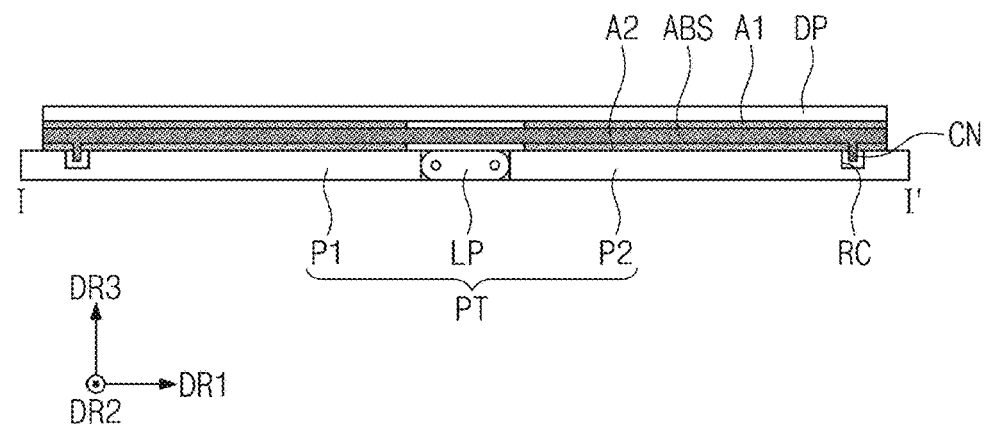
FIG. 3B is a cross-sectional view taken along a line I-I' of FIG. 3A.
Figure 4:
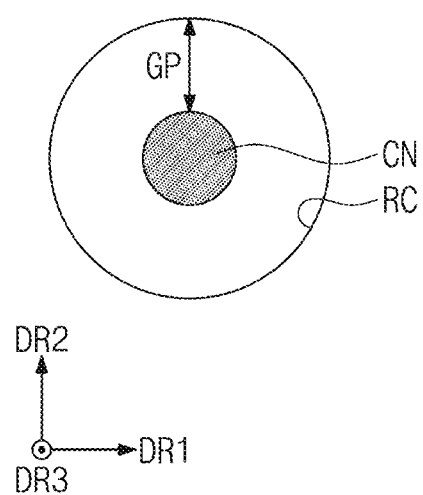
FIG. 4 is a plan view of a component illustrated in FIG. 3A.

FIG. 2A is an exploded perspective view illustrating an electronic apparatus according to an embodiment of the inventive concepts. FIG. 2B is a cross-sectional view illustrating some components of FIG. 2A. FIG. 3A is a plan view illustrating an assembled electronic apparatus according to an embodiment of the inventive concepts. FIG. 3B is a cross-sectional view taken along a line I-I' of FIG. 3A. FIG. 4 is a plan view of a component illustrated in FIG. 3A. FIG. 2B illustrates a cross-sectional view of an embodiment of the display unit DU for the purpose of ease and convenience in description. Hereinafter, an embodiment of the inventive concepts will be described in more detail with reference to FIGS. 2A to 4.

As illustrated in FIG. 2A, the display unit DU may include a display panel DP, a first adhesive member A1, an impact absorbing member ABS, and a second adhesive member A2.

The display panel DP may be a component which substantially displays the image IM. The front surface FS may mean a front surface of the display panel DP. The display panel DP may be activated by electrical signals to display the image IM and may be variously embodied. For example, the display panel DP may include, but is not limited to, an organic light emitting display panel, a quantum-dot display panel, an electrophoretic display panel, an electrowetting display panel, or a liquid crystal display panel.

Referring to FIG. 2B, the display panel DP may include a base substrate BS, a transistor TR, a light emitting element EE, and a plurality of insulating layers 10, 20, 30, 40, and 50. The insulating layers 10, 20, 30, 40, and 50 may include first to fifth insulating layers 10, 20, 30, 40, and 50 sequentially stacked in a third direction DR3 (e.g., the thickness direction of the display panel DP).

For example, the base substrate BS may include a plastic substrate, a glass substrate, or a metal substrate. The plastic substrate may include a resin. For example, the base substrate BS may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyimide-based resin, or a perylene-based resin.

The transistor TR may be disposed on the base substrate BS. The transistor TR and the light emitting element EE may constitute a pixel PX. The transistor TR may include a semiconductor pattern SP, a control electrode CE, an input electrode IE, and an output electrode OE. The semiconductor pattern SP may include a semiconductor material. For example, the semiconductor pattern SP may include at least one of a group 4 element, a group 8 element, or a metal oxide.

The control electrode CE may be disposed on the first insulating layer 10. The control electrode CE may overlap with the semiconductor pattern SP in a plan view and may be spaced apart from the semiconductor pattern SP. The control electrode CE may be spaced apart from the semiconductor pattern SP with the first insulating layer 10 interposed therebetween. However, embodiments of the inventive concepts are not limited thereto. In a transistor TR according to another embodiment, the semiconductor pattern SP may be disposed on the control electrode CE.

The input electrode IE and the output electrode OE may be disposed on the second insulating layer 20. The input electrode IE and the output electrode OE may be spaced apart from each other when viewed in a plan view. Each of the input electrode IE and the output electrode OE may penetrate the second insulating layer 20 and the first insulating layer 10 so as to be connected to the semiconductor pattern SP.

However, embodiments of the inventive concepts are not limited thereto. In a transistor TR according to certain embodiments, the input electrode IE and the output electrode OE may be disposed under the semiconductor pattern SP or may be disposed between the control electrode CE and the semiconductor pattern SP. Alternatively, the input electrode IE and the output electrode OE may be disposed on the same layer as the semiconductor pattern SP and may be in direct contact with the semiconductor pattern SP. The transistor TR according to embodiments of the inventive concepts may have any one of various structures and is not limited to a specific embodiment.

The light emitting element EE may be disposed on the third insulating layer 30. The light emitting element EE may include a first electrode E1, an emission pattern EP, and a second electrode E2. The first electrode E1 may be disposed on the third insulating layer 30 and may penetrate the third insulating layer 30 so as to be connected to the output electrode OE of the transistor TR. Also, even though not shown in the drawings, the display panel DP may further include a connection electrode disposed between the first electrode E1 and the transistor TR. In this case, the first electrode E1 may be electrically connected to the transistor TR through the connection electrode.

An opening 40-OP may be defined in the fourth insulating layer 40. The opening 40-OP may expose at least a portion of the first electrode E1. In the present embodiment, the fourth insulating layer 40 may be a pixel defining layer.

The emission pattern EP may be disposed in the opening 40-OP and may be disposed on the first electrode E1 exposed by the opening 40-OP. The emission pattern EP may include a light emitting material. For example, the emission pattern EP may include at least one of materials capable of emitting red light, green light, and/or blue light. In an embodiment, the emission pattern EP may include a fluorescent material and/or a phosphorescent material. The emission pattern EP may include an organic light emitting material and/or an inorganic light emitting material. The emission pattern EP may emit light in response to a potential difference between the first electrode E1 and the second electrode E2.

The second electrode E2 may be disposed on the emission pattern EP. The second electrode E2 may be opposite to the first electrode E1. The second electrode E2 may have a single unitary body shape in the active area AA. Thus, the second electrode E2 may be provided in common in a plurality of the pixels. The light emitting element EE disposed in each of the pixels may receive a common power source voltage through the second electrode E2.

The second electrode E2 may include a transparent conductive material or a semi-transparent conductive material. Thus, light generated from the emission pattern EP may easily exit in the third direction DR3 through the second electrode E2. However, embodiments of the inventive concepts are not limited thereto. In another embodiment, the first electrode E1 may include a transparent or semi-transparent conductive material, and the light emitting element EE may be driven as a rear surface light emitting type. In still another embodiment, the light emitting element EE may be driven as a both surface light emitting type in which light exits through a front surface and a rear surface.

The fifth insulating layer 50 may be disposed on the light emitting element EE to encapsulate the light emitting element EE. In the present embodiment, the fifth insulating layer 50 may be an encapsulation layer. The fifth insulating layer 50 may have a single unitary body shape in the active area AA. Thus, the fifth insulating layer 50 may be provided in common in the plurality of pixels. Also, in some embodiments, a capping layer covering the second electrode E2 may be disposed between the second electrode E2 and the fifth insulating layer 50.

The fifth insulating layer 50 may include a first inorganic layer 51, an organic layer 52 and a second inorganic layer 53, which are sequentially stacked in the third direction DR3. In the present embodiment, each of the first inorganic layer 51, the organic layer 52, and the second inorganic layer 53 is illustrated as a single layer. However, embodiments of the inventive concepts are not limited thereto. In certain embodiments, at least one of the first inorganic layer 51, the organic layer 52, or the second inorganic layer 53 may be provided in plurality or may be omitted.

The first inorganic layer 51 may cover the second electrode E2. The first inorganic layer 51 may prevent external moisture and/or oxygen from permeating into the light emitting element EE. For example, the first inorganic layer 51 may include silicon nitride, silicon oxide, silicon oxynitride, or a combination thereof. The first inorganic layer 51 may be formed by a deposition process.

The organic layer 52 may be disposed on the first inorganic layer 51 and may be in contact with the first inorganic layer 51. The organic layer 52 may provide a flat surface on the first inorganic layer 51. For example, the organic layer 52 may provide the flat surface in the active area AA.

The organic layer 52 may cover a bent portion of a top surface of the first inorganic layer 51 and/or a particle existing on the first inorganic layer 51, and thus it is possible to block the influence of the state of the top surface of the first inorganic layer 51 on components formed on the organic layer 52. In addition, the organic layer 52 may relax or release stress between layers in contact with the organic layer 52. The organic layer 52 may include an organic material and may be formed by a solution process such as a spin coating process, a slit coating process, and/or an inkjet process.

The second inorganic layer 53 may be disposed on the organic layer 52 to cover the organic layer 52. The second inorganic layer 53 may be stably formed on the top surface of the organic layer 52, which is relatively flat as compared with the top surface of the first inorganic layer 51. The second inorganic layer 53 may encapsulate moisture outputted or evaporated from the organic layer 52 to prevent or block the moisture from being provided (or escaping) to the outside. For example, the second inorganic layer 53 may include silicon nitride, silicon oxide, silicon oxynitride, or a combination thereof. The second inorganic layer 53 may be formed by a deposition process.

However, embodiments of the inventive concepts are not limited thereto. In another embodiment, the fifth insulating layer 50 may be provided as a single layer in the display panel DP.

Referring again to FIG. 2A, the display panel DP may include a folding portion FBP, a first non-folding portion NFP1, and a second non-folding portion NFP2, when viewed in a plan view. The folding portion FBP may overlap with the folding axis FX (see FIG. 1A), and a shape of the folding portion FBP may be deformed when the electronic apparatus EA is in the folded state. In an embodiment, when the electronic apparatus EA is in the folded state, folding stress including compressive stress and tensile stress may be applied to the folding portion FBP.

The first non-folding portion NFP1 and the second non-folding portion NFP2 may be disposed at both sides (e.g., lateral or opposite sides) of the folding portion FBP, respectively. The first non-folding portion NFP1 and the second non-folding portion NFP2 may be spaced apart from each other in a first direction DR1 with the folding portion FBP interposed therebetween. The first and second non-folding portions NFP1 and NFP2 may be connected to the folding portion FBP, and the first and second non-folding portions NFP1 and NFP2 and the folding portion FBP may constitute a single unitary body shape (e.g., a single integral body).

The impact absorbing member ABS may be disposed between the display panel DP and the support unit PT. The impact absorbing member ABS may reduce the intensity of an external impact transmitted to the display panel DP through the support unit PT. The impact absorbing member ABS may have a modulus lower than that of the first support portion P1 or the second support portion P2. Here, the modulus refers to an elastic modulus that is a ratio between stress and strain. Elastic moduli can be, e.g., of three types, Young's modulus, Shear modulus, and Bulk modulus, that specify how stress and strain are to be measured.

The first adhesive member A1 may be disposed between the impact absorbing member ABS and the display panel DP to physically couple the impact absorbing member ABS and the display panel DP to each other. The first adhesive member A1 may have adhesiveness. For example, the first adhesive member A1 may include a pressure sensitive adhesive (PSA).

The first adhesive member A1 may include a first adhesive portion A11 and a second adhesive portion A12. The first adhesive portion A11 and the second adhesive portion A12 may be spaced apart from each other in the first direction DR1. The first adhesive portion A11 may couple the first non-folding portion NFP1 of the display panel DP and the impact absorbing member ABS to each other. The second adhesive portion A12 may couple the second non-folding portion NFP2 of the display panel DP and the impact absorbing member ABS to each other.

The second adhesive member A2 may be disposed between the impact absorbing member ABS and the support unit PT to physically couple the impact absorbing member ABS and the support unit PT to each other. The second adhesive member A2 may have adhesiveness. For example, the second adhesive member A2 may include a pressure sensitive adhesive (PSA).

The second adhesive member A2 may include a third adhesive portion A21 and a fourth adhesive portion A22. The third adhesive portion A21 and the fourth adhesive portion A22 may be spaced apart from each other in the first direction DR1. The third adhesive portion A21 may couple the first support portion P1 of the support unit PT and the impact absorbing member ABS to each other. The fourth adhesive portion A22 may couple the second support portion P2 of the support unit PT and the impact absorbing member ABS to each other.

Referring to FIG. 3B, the folding portion FBP of the display panel DP and the hinge portion LP of the support unit PT may not overlap with the first and second adhesive members A1 and A2 when viewed in a plan view. The folding portion FBP and the hinge portion LP may not be coupled to the first and second adhesive members A1 and A2.

According to an embodiment of the inventive concepts, the first and second adhesive members A1 and A2 may be removed from an area overlapping with the folding axis FX, and thus a thickness of the electronic apparatus EA in an area overlapping with the folding portion FBP may be less than thicknesses of the electronic apparatus EA in areas overlapping with the first and second non-folding portions NFP1 and NFP2. As a result, the folding stress affecting the folding portion FBP and the hinge portion LP may be reduced.

Also, at least one receiving portion RC may be defined in the support unit PT according to an embodiment of the inventive concepts. In the present embodiment, two receiving portions RC are defined in the first support portion P1, and two receiving portions RC are defined in the second support portion P2.

The receiving portion RC may receive a protrusion CN. The protrusion CN may penetrate the second adhesive member A2 so as to be connected to the impact absorbing member ABS. The protrusion CN may protrude from a bottom surface of the impact absorbing member ABS and may be received in the receiving portion RC. The protrusion CN and the impact absorbing member ABS may constitute a single unitary body shape. Alternatively, the protrusion CN may be physically connected to the impact absorbing member ABS like a bolt or may be physically connected to the impact absorbing member ABS through an adhesive member.

The protrusion CN may be provided in plurality, and the protrusions CN may be received in the receiving portions RC, respectively. As illustrated in FIG. 4, a planar size of the protrusion CN may be less than a planar size of the receiving portion RC. Thus, the protrusion CN may be laterally movable by a set or predetermined distance GP in the receiving portion RC. According to the embodiment of the inventive concepts, since the protrusion CN is coupled to the impact absorbing member ABS, lateral movement of the impact absorbing member ABS and the display panel DP physically coupled to the impact absorbing member ABS may be controlled. Thus, excessive lateral movement of the display unit DU by an external impact may be controlled.

Figure 5A:
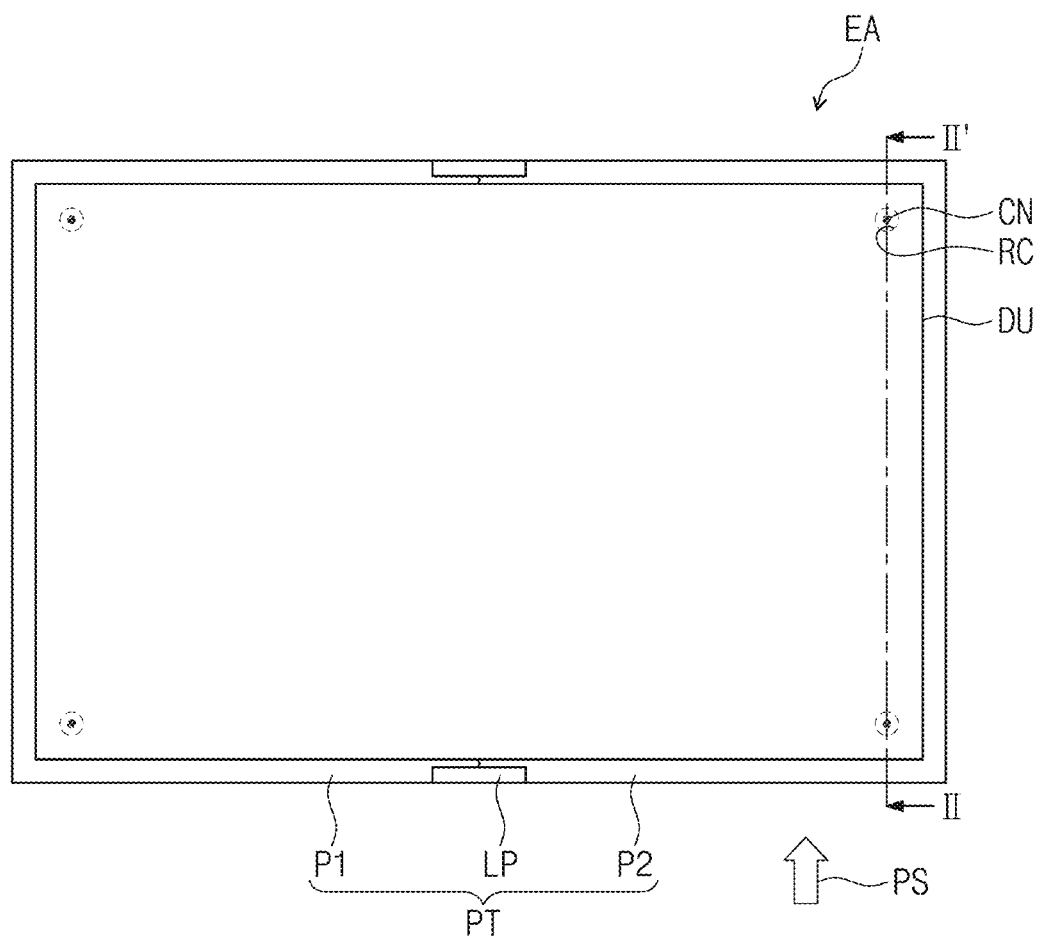
FIGS. 5A and 5B are plan views illustrating an electronic apparatus according to an embodiment of the inventive concepts.
Figure 5B:
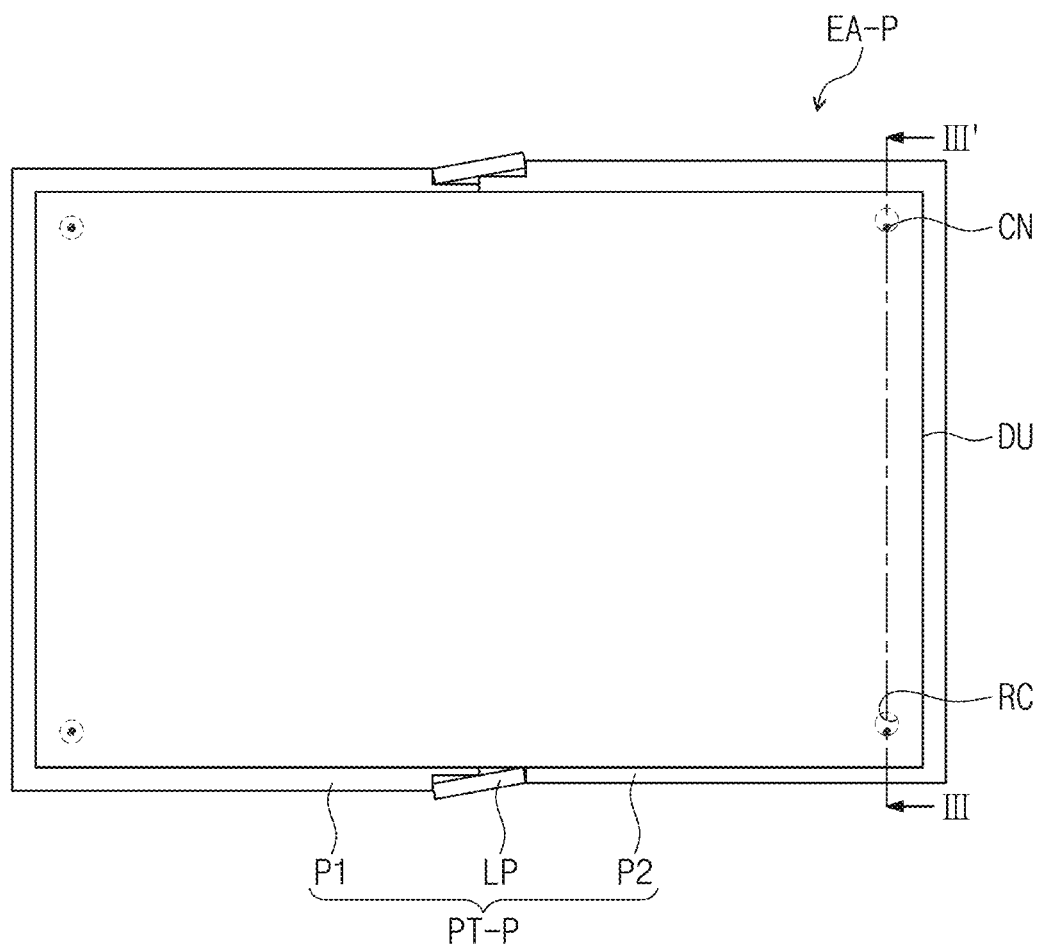
Figure 5C:
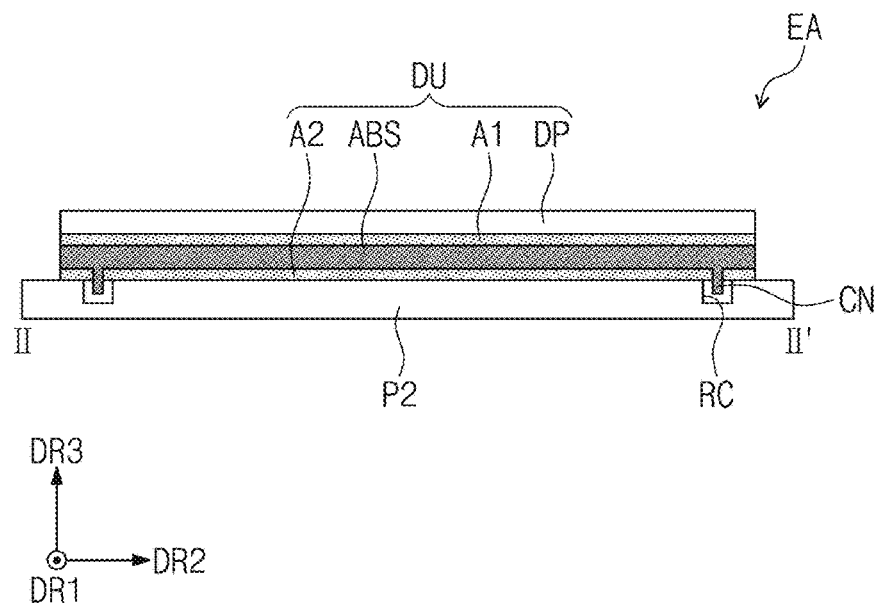
FIG. 5C is a cross-sectional view taken along a line II-II' of FIG. 5A.
Figure 5D:
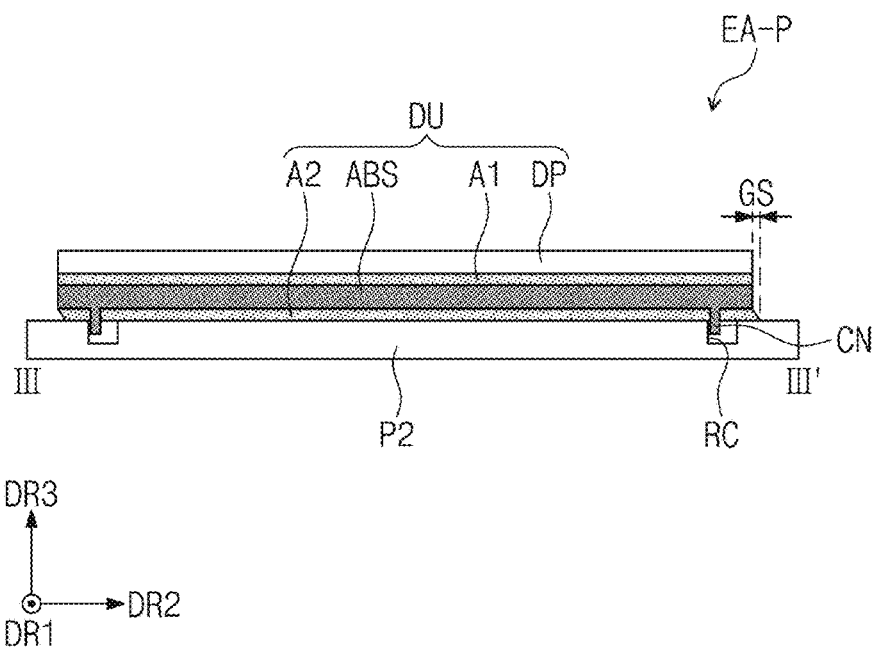
FIG. 5D is a cross-sectional view taken along a line III-III' of FIG. 5B.

FIGS. 5A and 5B are plan views illustrating an electronic apparatus according to an embodiment of the inventive concepts. FIG. 5C is a cross-sectional view taken along a line II-II' of FIG. 5A, and FIG. 5D is a cross-sectional view taken along a line III-III' of FIG. 5B. For the purpose of ease and convenience in description, FIG. 5A illustrates the electronic apparatus EA to which an external impact is not applied, and FIG. 5B illustrates an electronic apparatus EA-P to which an external impact is applied. Hereinafter, an embodiment of the inventive concepts will be described with reference to FIGS. 5A to 5D.

As illustrated in FIGS. 5A and 5B, when an external impact PS is applied in an arrow direction (FIG. 5A), the electronic apparatus EA may be deformed into a bent electronic apparatus EA-P. For example, the second support portion P2 may be moved from the first support portion P1 by the external impact PS in the direction in which the external impact PS is applied. In the present embodiment, bent deformation may occur at the support unit PT by a difference in movement between the first support portion P1 and the second support portion P2.

The shape of the bent electronic apparatus EA-P (FIG. 5B) may be generated by substantially the bent support unit PT-P (from the shape of the electronic apparatus EA in FIG.

5B). The shape of the bent support unit PT-P may be generated because the first support portion P1 or the second support portion P2 is instantaneously moved by the external impact PS by a clearance inherent in the electronic apparatus EA, for example, by a clearance according to an assembly tolerance between the hinge portion LP and the first support portion P1 or between the hinge portion LP and the second support portion P2.

Referring to FIG. 5C, before the external impact PS is applied, the protrusion CN may be received in the receiving portion RC in the electronic apparatus EA. At this time, the protrusion CN may be disposed at a center of the receiving portion RC.

Referring to FIG. 5D, when the external impact PS is applied, the bent electronic apparatus EA-P may be concurrently or instantaneously deformed such that the second support portion P2 is relatively moved from the first support portion P1 in the second direction DR2. At this time, the display panel DP may be fixed in place due to inertia, and set or predetermined deformation GS may occur at the second adhesive member A2. The deformation GS of the second adhesive member A2 may correspond to substantially a movement distance of the second support portion P2 in the second direction DR2 with respect to the first support portion P1.

At this time, the protrusion CN may be in contact with an inner sidewall of the receiving portion RC. The protrusion CN may be connected to the impact absorbing member ABS and may be substantially physically connected to the display panel DP. Since the protrusion CN is received in the receiving portion RC, a movement distance of the display unit DU in a plan view may be controlled in the size of the receiving portion RC.

According to the embodiment of the inventive concepts, even though the laterally bent deformation occurs at the support unit PT by the external impact PS, the display panel DP may be independent of the support unit PT-P, and thus damage of the display panel DP may be reduced or prevented. In addition, according to the embodiment of the inventive concepts, the protrusion CN may be received in the receiving portion RC, and thus excessive deformation of the support unit PT may be easily reduced or prevented. As a result, reliability of the electronic apparatus EA may be improved.

Figure 6A:
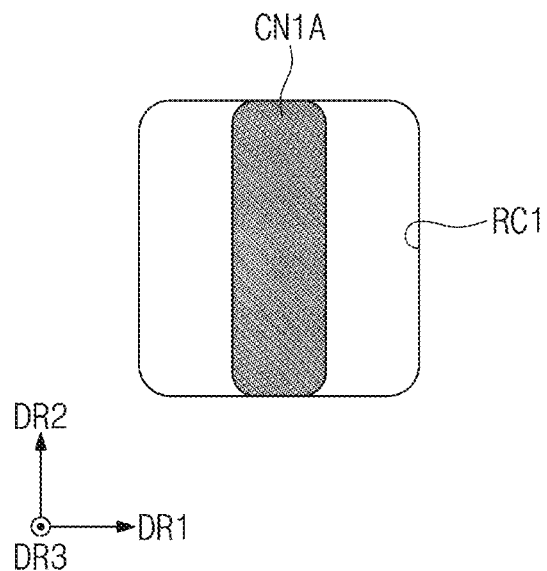
FIGS. 6A and 6B are plan views schematically illustrating a component of an electronic apparatus according to some embodiments of the inventive concepts.
Figure 6B:
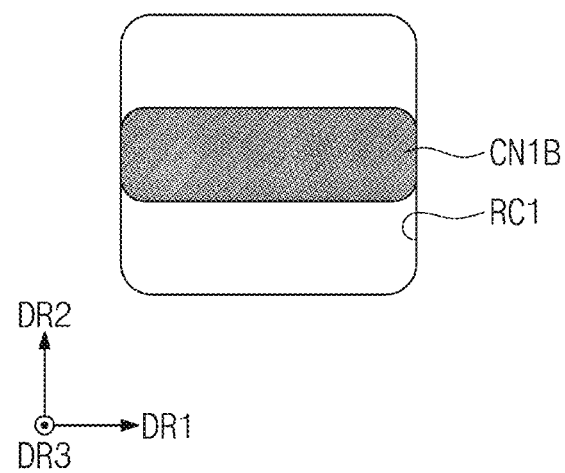
Figure 7A:
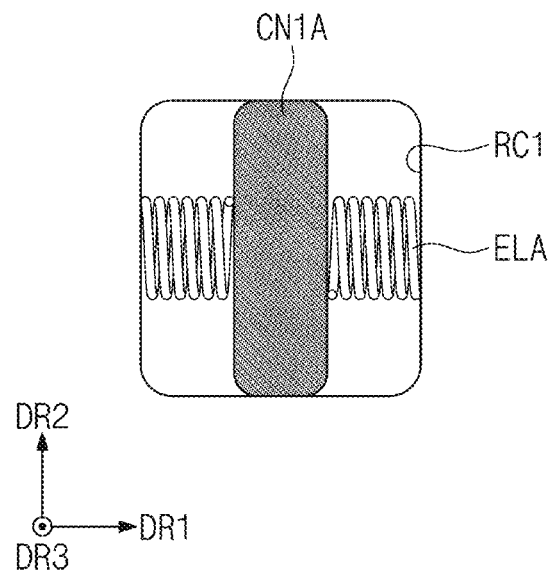
FIGS. 7A to 7C are plan views schematically illustrating some components of an electronic apparatus according to some embodiments of the inventive concepts.
Figure 7B:
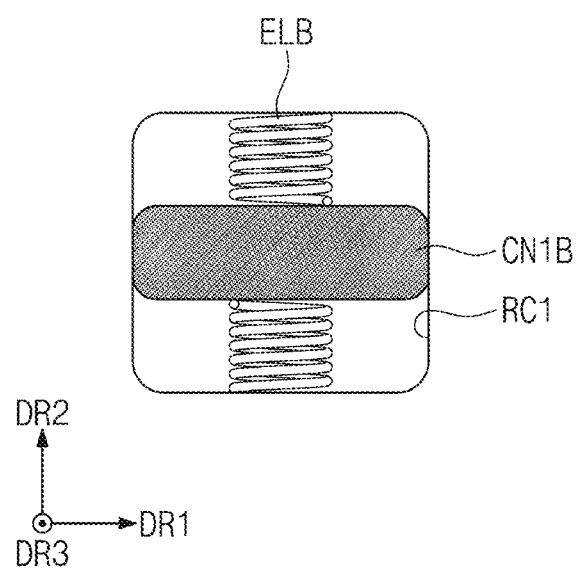
Figure 7C:
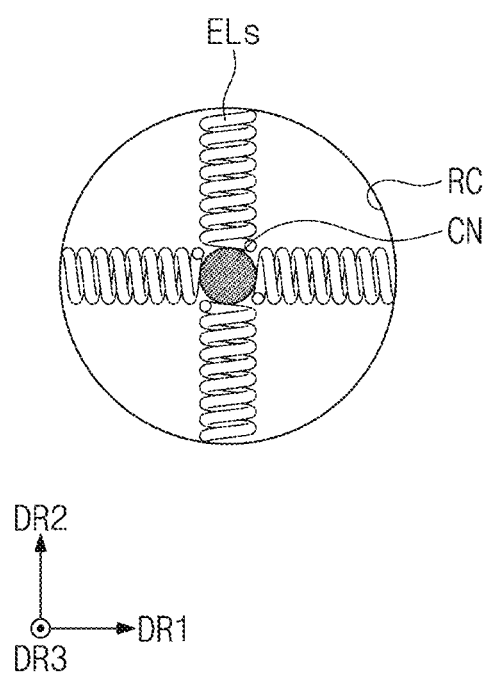

FIGS. 6A and 6B are plan views schematically illustrating a component of an electronic apparatus according to some embodiments of the inventive concepts. FIGS. 7A to 7C are plan views schematically illustrating some components of an electronic apparatus according to some embodiments of the inventive concepts. Protrusions and receiving portions are illustrated in FIGS. 6A to 7C. Hereinafter, embodiments of the inventive concepts will be described with reference to FIGS. 6A to 7C.

As illustrated in FIGS. 6A and 6B, a receiving portion RC1 may have another shape other than a circular shape as illustrated above. Here, the receiving portion RC1 may have a quadrilateral shape of which vertexes are round. As illustrated in FIG. 6A, a protrusion CN1A may be provided in a shape having a length extending in the second direction DR2. The protrusion CN1A may be in contact with an upper side and a lower side of the receiving portion RC1 when viewed in a plan view. Thus, lateral movement of the protrusion CN1A in a direction parallel to the second direction DR2 may be relatively fixed, and lateral movement of the protrusion CN1A in a direction parallel to the first direction DR1 may be relatively fluidly controlled.

Alternatively, as illustrated in FIG. 6B, a protrusion CN1B may be provided in a shape having a length extending in the first direction DR1. The protrusion CN1B may be in contact with a left side and a right side of the receiving portion RC1 when viewed in a plan view. Thus, lateral movement of the protrusion CN1B in a direction parallel to the first direction DR1 may be relatively fixed, and lateral movement of the protrusion CN1B in a direction parallel to the second direction DR2 may be relatively fluidly controlled.

Referring to FIGS. 6A and 6B, the lateral movement of the protrusion CN1A or CN1B may be controlled as one-directional movement in the direction parallel to the first direction DR1 or the direction parallel to the second direction DR2. As a result, the shape of the protrusion CN1A or CN1B and/or the shape of the receiving portion RC1 may be controlled depending on a direction of an external impact applied to the electronic apparatus, and thus the reliability of the electronic apparatus may be improved.

As illustrated in FIGS. 7A and 7B, an electronic apparatus according to some embodiments of the inventive concepts may further include an elastic member ELA or ELB. The elastic member ELA or ELB may include a material having high elastic force, e.g., a spring, a sponge, or a damper. The elastic member ELA or ELB may be disposed in an empty space between the protrusion CN1A or CN1B and the receiving portion RC1 to control movement of the protrusion CN1A or CN1B.

For example, as illustrated in FIG. 7A, the elastic member ELA may be provided in plurality, and the elastic members ELA may be disposed in the empty space between the protrusion CN1A and the receiving portion RC1. The elastic members ELA may be disposed between the left side of the receiving portion RC1 and the protrusion CN1A and between the right side of the receiving portion RC1 and the protrusion CN1A, respectively. Thus, left and right movement of the protrusion CN1A may be relatively reduced, as compared with the protrusion CN1A illustrated in FIG. 6A.

Alternatively, as illustrated in FIG. 7B, the elastic member ELB may be provided in plurality, and the elastic members ELB may be disposed in the empty space between the protrusion CN1B and the receiving portion RC1. The elastic members ELB may be disposed between the upper side of the receiving portion RC1 and the protrusion CN1B and between the lower side of the receiving portion RC1 and the protrusion CN1B, respectively. Thus, up and down movement of the protrusion CN1B in a plan view may be relatively reduced, as compared with the protrusion CN1B illustrated in FIG. 6B.

In certain embodiments, an elastic member ELs may be disposed in a receiving portion RC having a circular shape, as illustrated in FIG. 7C. Substantially, the elastic member ELs may be disposed in an empty space between the receiving portion RC and the protrusion CN, illustrated in FIG. 4. In the present embodiment, four elastic members ELs may be provided between the protrusion CN and the inner sidewall of the receiving portion RC, and thus up, down, left and right movement of the protrusion CN may be relatively reduced, as compared with the protrusion CN illustrated in FIG. 4.

Figure 8A:
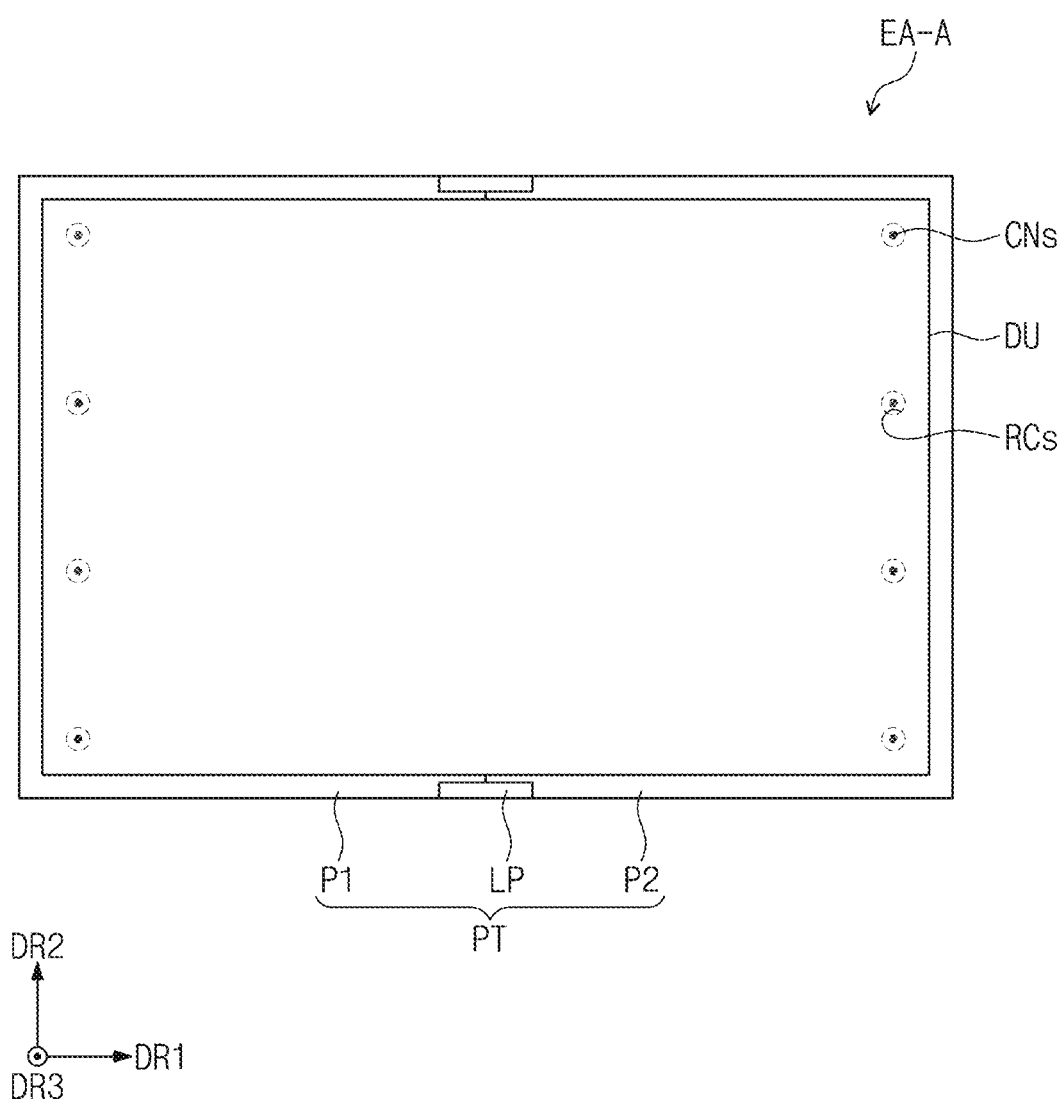
FIGS. 8A and 8B are plan views illustrating electronic apparatuses according to some embodiments of the inventive concepts.
Figure 8B:
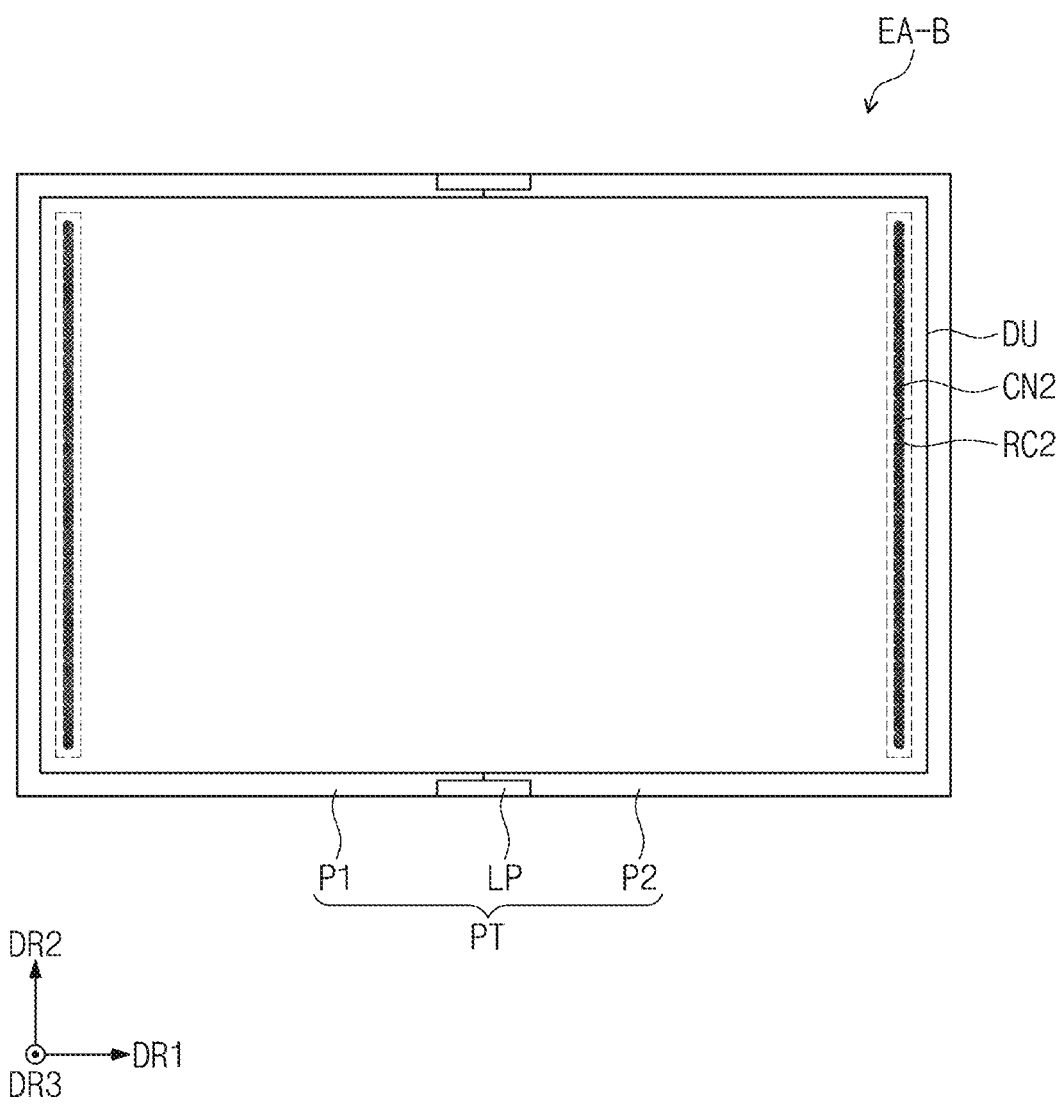

FIGS. 8A and 8B are plan views illustrating electronic apparatuses according to some embodiments of the inventive concepts. FIGS. 8A and 8B illustrate areas corresponding to FIG. 3A for the purpose of ease and convenience in description. Hereinafter, some embodiments of the inventive concepts will be described with reference to FIGS. 8A and 8B. In addition, the same components as described with reference to FIGS. 1A to 7C will be indicated by the same reference designators, and the descriptions thereof will not be provided again for the purpose of ease and convenience in description and understanding.

As illustrated in FIG. 8A, the numbers of receiving portions RC and protrusions CN in an electronic apparatus EA-A may be more than the numbers of the receiving portions RC and the protrusions CN in the electronic apparatus EA illustrated in FIG. 3A. Sizes of the receiving portion RC and the protrusion CN may be different from the sizes of the receiving portion RC and the protrusion CN of FIG. 3A. However, embodiments of the inventive concepts are not limited thereto.

As illustrated in FIG. 8B, a receiving portion RC2 may be provided in a bar or groove shape having a length extending in the second direction DR2. A protrusion CN2 may be provided in a bar shape having a length extending in the second direction DR2 such that the shape of the protrusion CN2 corresponds to (e.g., matches) the shape of the receiving portion RC2. A length and a width of the protrusion CN2 may be designed in such a way that a separation distance between the protrusion CN2 and the receiving portion RC2 in the first direction DR1 is equal to a separation distance between the protrusion CN2 and the receiving portion RC2 in the second direction DR2. Thus, lateral movement of the display unit DU by an external impact applied to an electronic apparatus EA-B may be easily controlled, and reliability of the electronic apparatus EA-B may be improved.

Figure 9A:
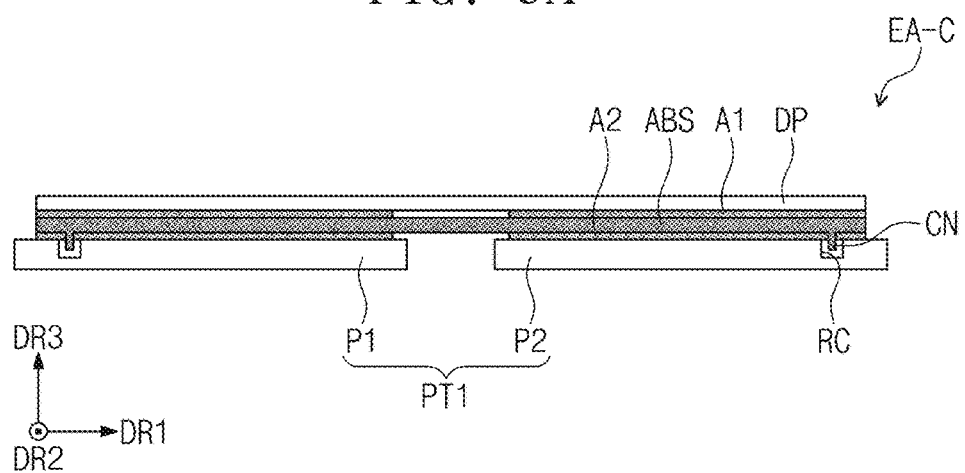
FIGS. 9A to 9C are cross-sectional views illustrating electronic apparatuses according to some embodiments of the inventive concepts.
Figure 9B:
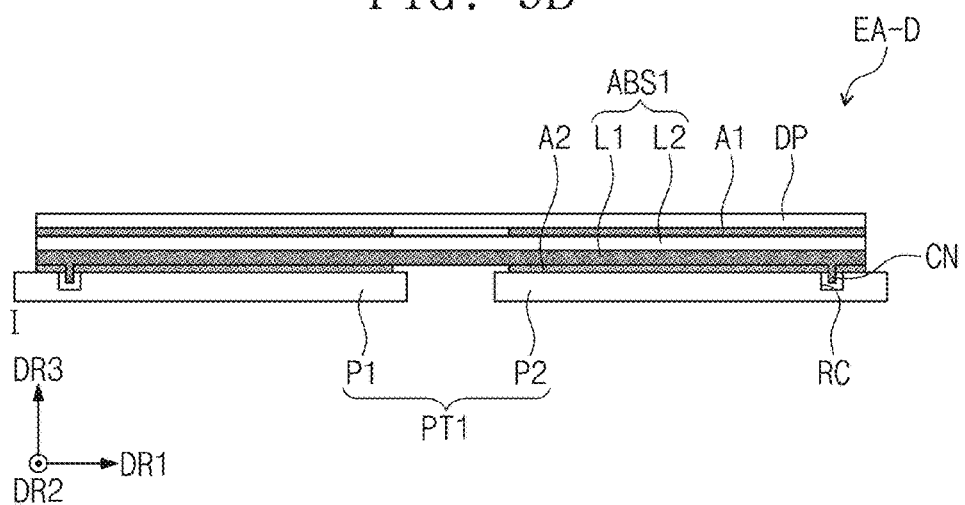
Figure 9C:
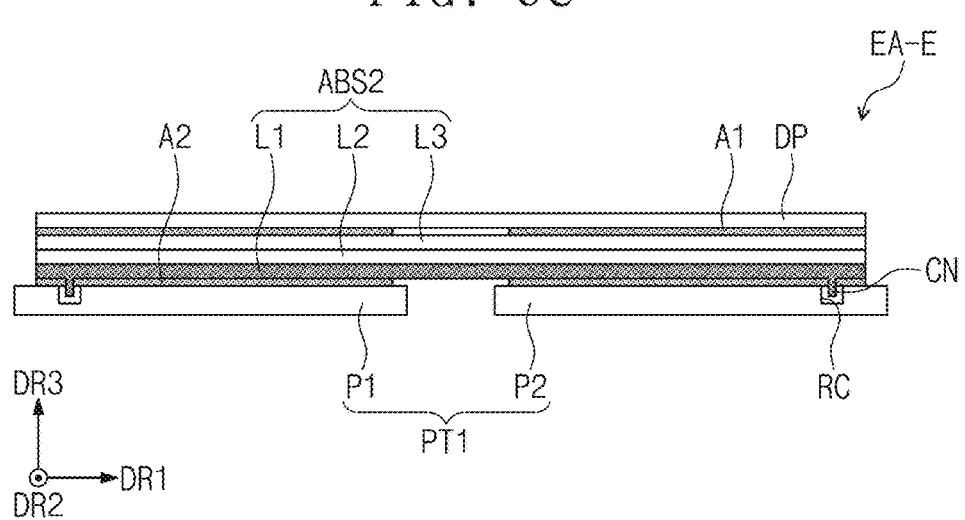

FIGS. 9A to 9C are cross-sectional views illustrating electronic apparatuses according to some embodiments of the inventive concepts. FIGS. 9A to 9C illustrate areas corresponding to FIG. 3B for the purpose of ease and convenience in description. Hereinafter, embodiments of the inventive concepts will be described with reference to FIGS. 9A to 9C. In addition, the same components as described with reference to FIGS. 1A to 8B will be indicated by the same reference designators, and the descriptions thereof will be omitted for the purpose of ease and convenience in description and illumination.

As illustrated in FIG. 9A, in an electronic apparatus EA-C, a support unit PT1 may include the first support portion P1 and the second support portion P2. In the support unit PT1, the hinge portion LP of FIG. 3B may be omitted. Thus, areas of the display unit corresponding to the non-folding portions NFP1 and NFP2 (see FIG. 2A) of the display panel DP may be supported by the support unit PT1, but an area of the display unit corresponding to the folding portion FBP (see FIG. 2A) may not overlap with the support unit PT1 when viewed in a plan view.

As illustrated in FIGS. 9B and 9C, in an electronic apparatus EA-D or EA-E, an impact absorbing member ABS1 or ABS2 may include a plurality of layers. For example, as illustrated in FIG. 9B, the electronic apparatus EA-D may include the impact absorbing member ABS1 including a first layer L1 and a second layer L2. The protrusion CN may be connected to the first layer L1.

Alternatively, as illustrated in FIG. 9C, the electronic apparatus EA-E may include the impact absorbing member ABS2 including a first layer L1, a second layer L2 and a third layer L3, which are sequentially stacked in the third direction DR3. The protrusion CN may be connected to the first layer L1.

Since the impact absorbing member ABS1 or ABS2 includes the plurality of layers, characteristics of reducing or relaxing an impact thereof may be improved. As a result, an impact transmitted to the display panel DP through the support unit PT1 may be reduced to improve stability of the display panel DP.

In addition, since the impact absorbing member ABS1 or ABS2 includes the plurality of layers, folding stress may be dispersed in the layers. Thus, folding characteristics of the impact absorbing member ABS1 or ABS2 may be improved as compared with the case in which the impact absorbing member is a single layer.

Figure 10A:
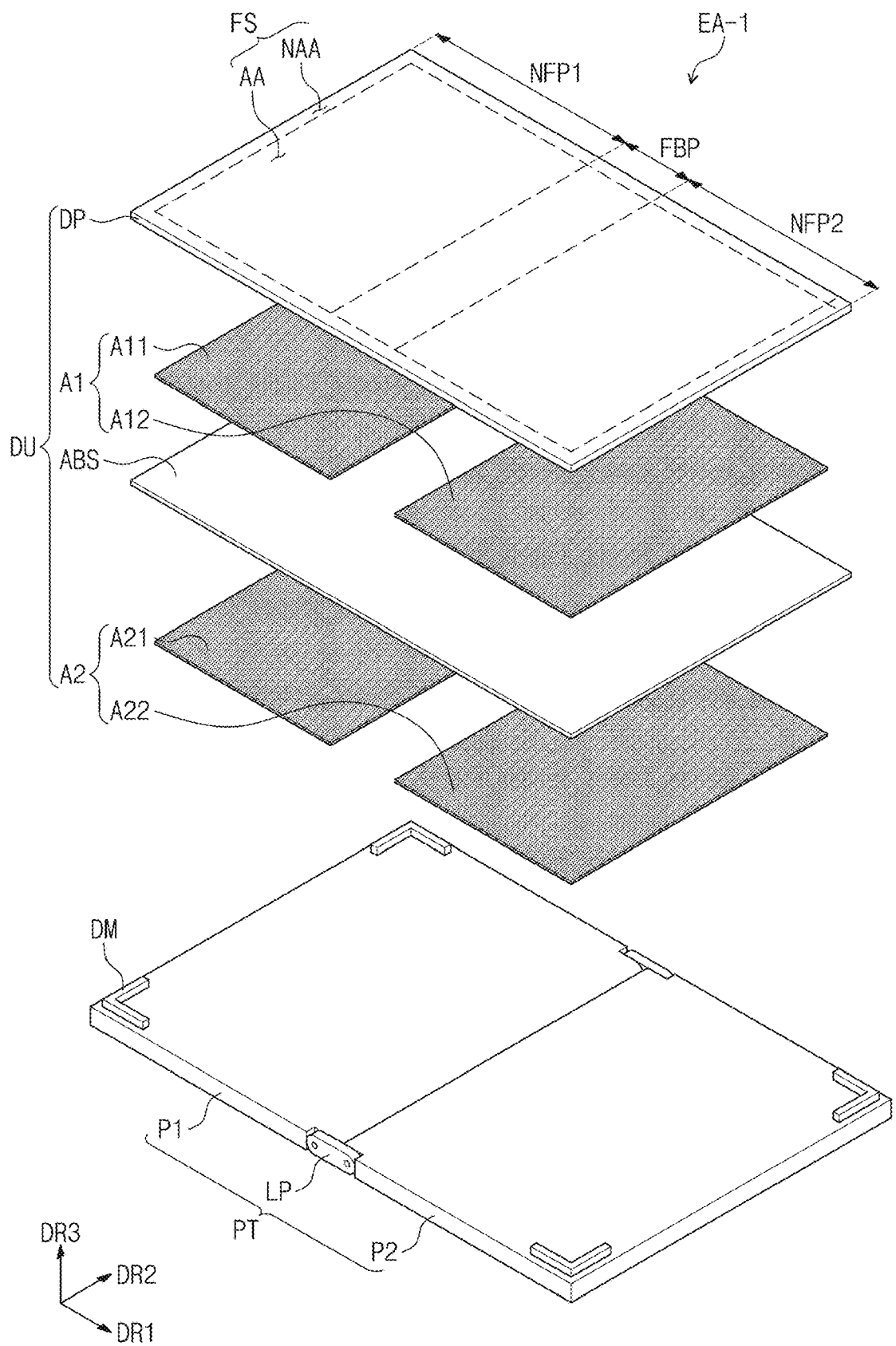
FIG. 10A is an exploded perspective view illustrating an electronic apparatus according to an embodiment of the inventive concepts.
Figure 10B:
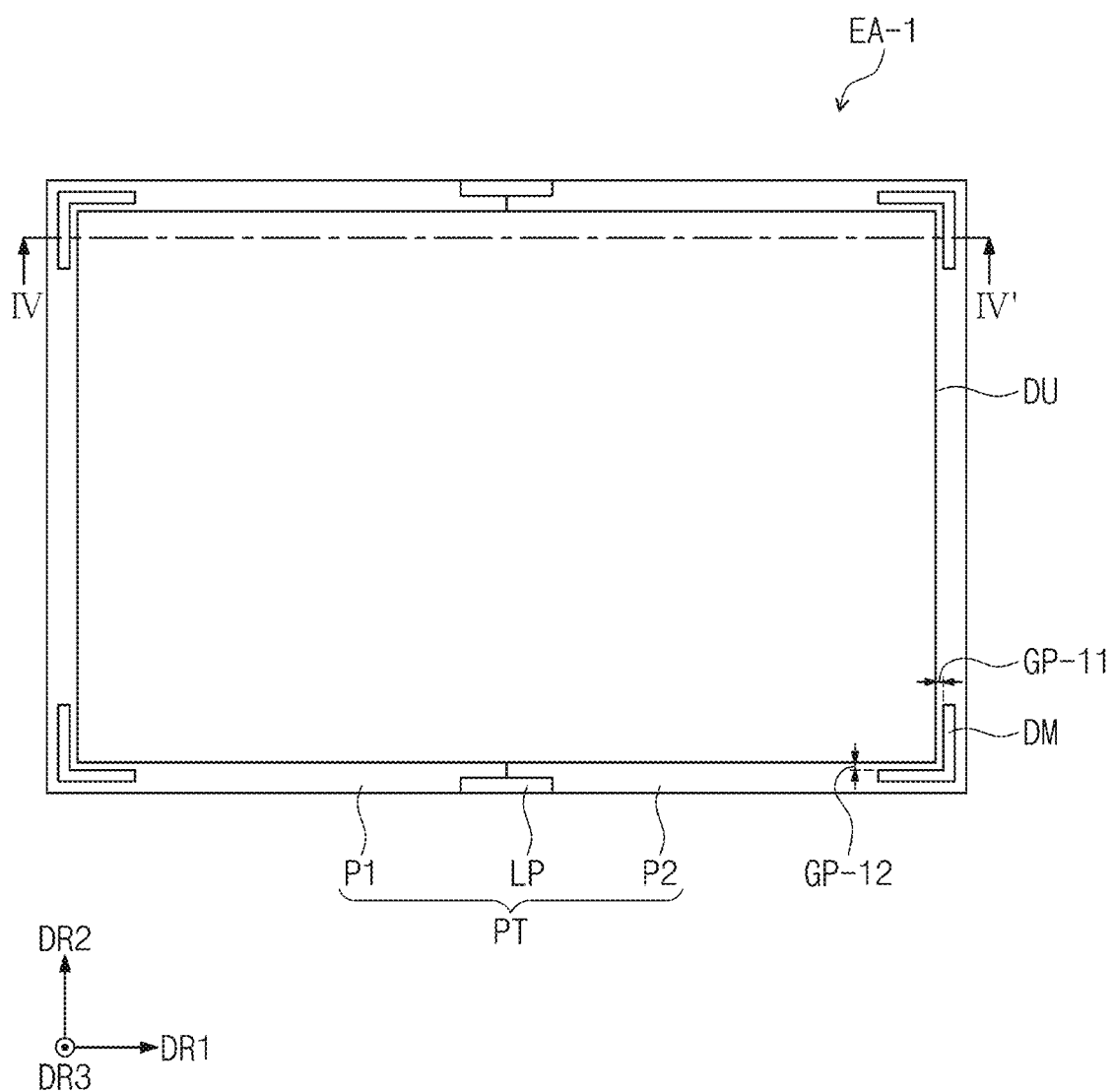
FIGS. 10B and 10C are plan views illustrating electronic apparatuses according to some embodiments of the inventive concepts.
Figure 10C:
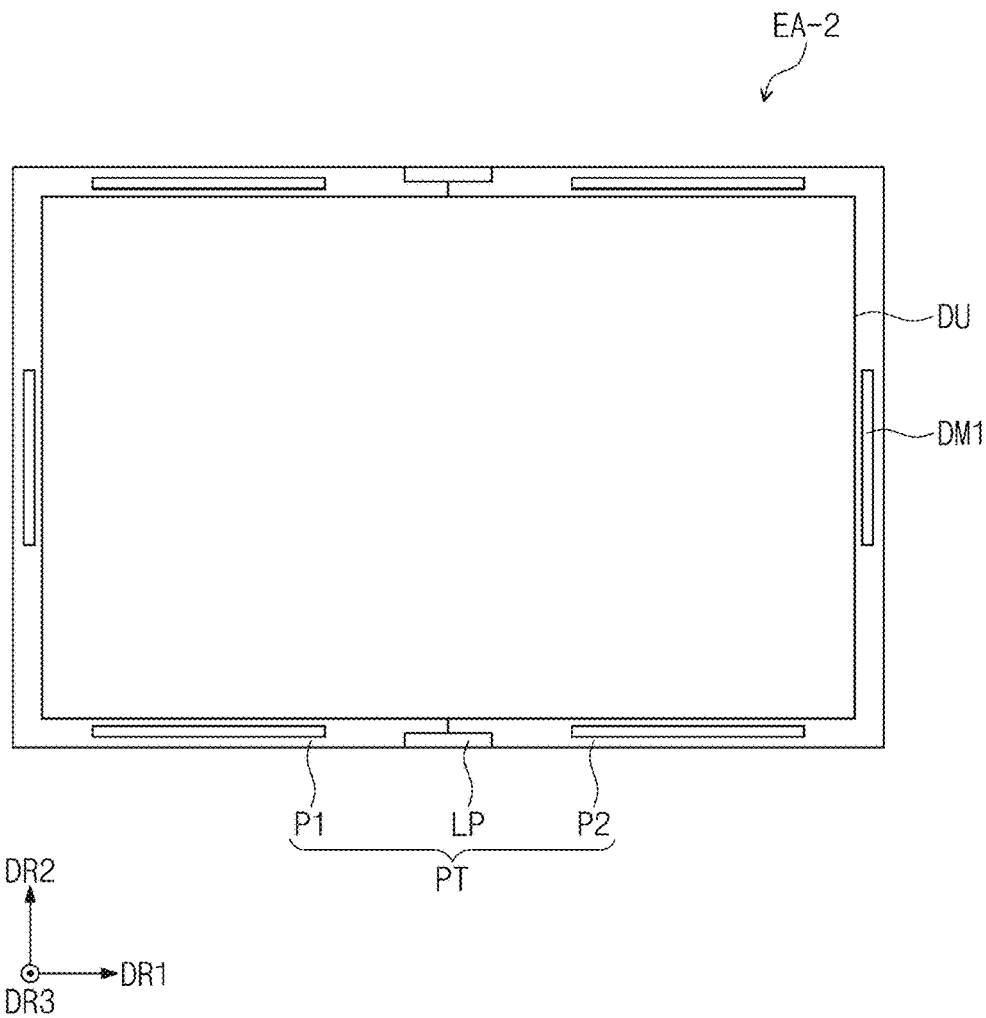
Figure 10D:
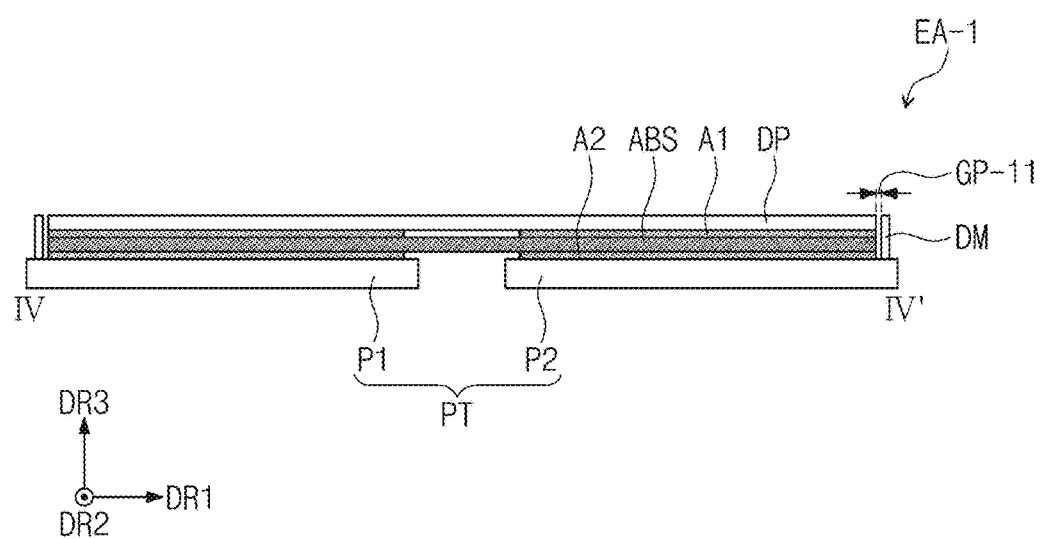
FIG. 10D is a cross-sectional view of the electronic apparatus illustrated in FIG. 10A.

FIG. 10A is an exploded perspective view illustrating an electronic apparatus according to an embodiment of the inventive concepts. FIGS. 10B and 10C are plan views illustrating electronic apparatuses according to some embodiments of the inventive concepts. FIG. 10D is a cross-sectional view of the electronic apparatus illustrated in FIG. 10A. FIG. 10B illustrates a plan view of the electronic apparatus EA-1 illustrated in FIG. 10A, and FIG. 10C illustrates a plan view of an electronic apparatus EA-2 according to an embodiment of the inventive concepts. FIG. 10D is a cross-sectional view taken along a line IV-IV' of FIG. 10B. Hereinafter, embodiments of the inventive concepts will be described with reference to FIGS. 10A to 10D.

As illustrated in FIGS. 10A, 10B, and 10D, the electronic apparatus EA-1 may further include a guide portion DM. The guide portion DM may be disposed on the support unit PT. For example, the guide portion DM may be disposed on each of the first and second support portions P1 and P2. The guide portion DM may be spaced apart from the display unit DU when viewed in a plan view. The guide portion DM may be disposed at a position surrounding each of four vertexes of the display unit DU.

In the present embodiment, the guide portion DM may control lateral movement of the display unit DU to be within a set or predetermined range. For example, the guide portion DM may be spaced apart from the display unit DU by a first distance GP-11 in the first direction DR1 and may be spaced apart from the display unit DU by a second distance GP-12 in the second direction DR2. As illustrated in FIG. 10D, the guide portion DM may have a height equal to a thickness of the display unit DU. Thus, undesired movement of the display unit DU (e.g., the display panel DP) may be stably blocked or prevented. However, embodiments of the inventive concepts are not limited thereto. In another embodiment, the height of the guide portion DM may be less than the thickness of the display unit DU.

According to the embodiment of the inventive concepts, even though a clearance occurs between the first support portion P1 and the second support portion P2 by an external impact, lateral movement of the display unit DU may be controlled in the first distance GP-11 or the second distance GP-12, thereby reducing or preventing damage of the display unit DU.

Alternatively, in the electronic apparatus EA-2, a shape of a guide portion DM1 may be variously modified, as illustrated in FIG. 10C. The guide portion DM1 may be provided in plurality, and the guide portions DM1 may have bar shapes extending along edges of the display unit DU. Thus, damage of the display unit DU by an external impact may be reduced or prevented, and reliability of the electronic apparatus EA-2 may be improved.

Figure 11A:
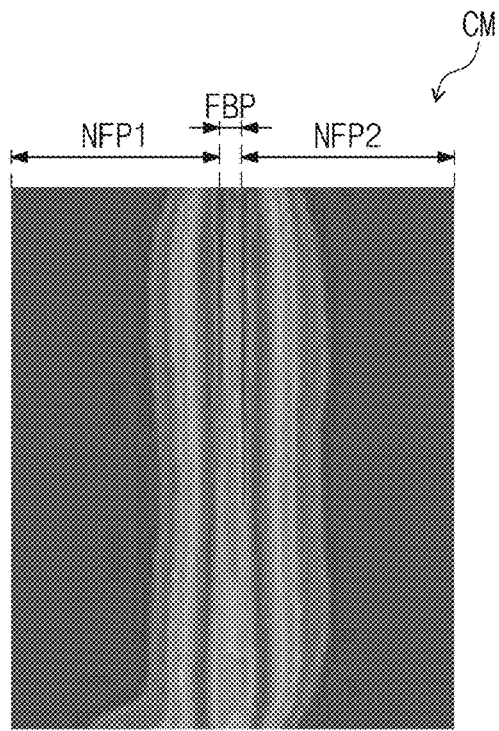
FIGS. 11A to 12B are images showing portions of electronic apparatuses according to comparative examples of the inventive concepts.
Figure 11B:
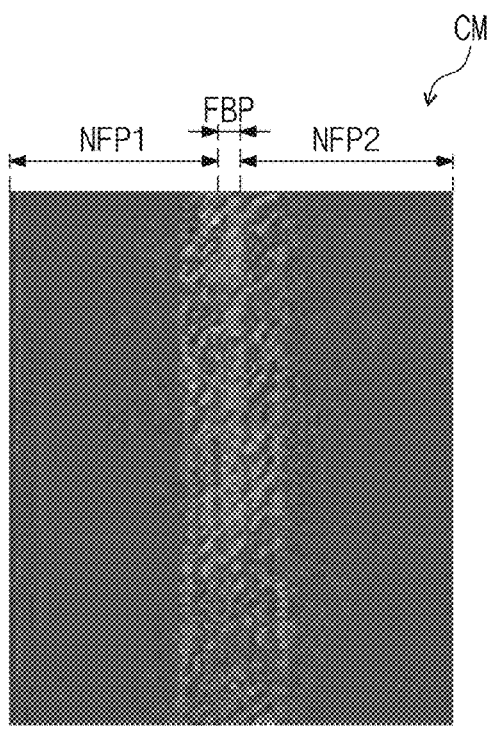
Figure 12A:
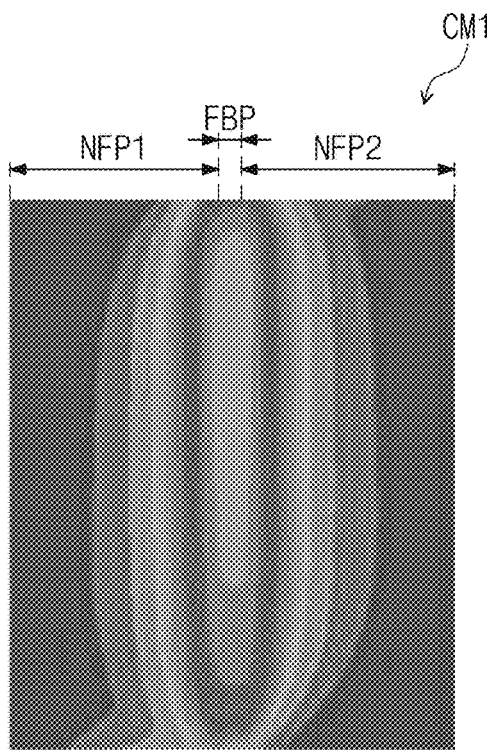
Figure 12B:
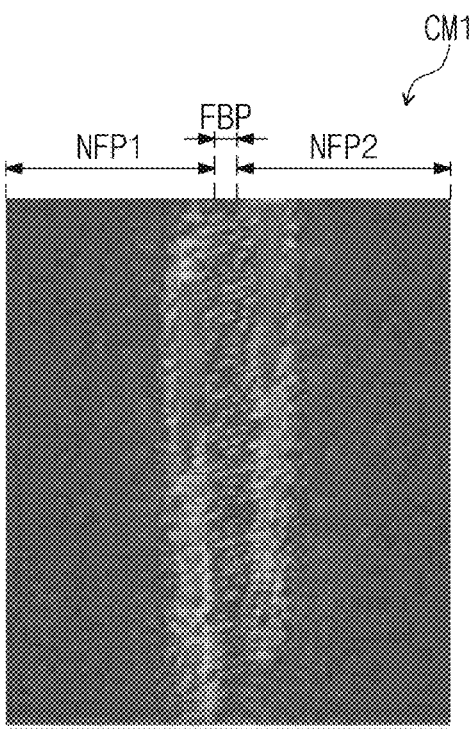
Figure 13A:
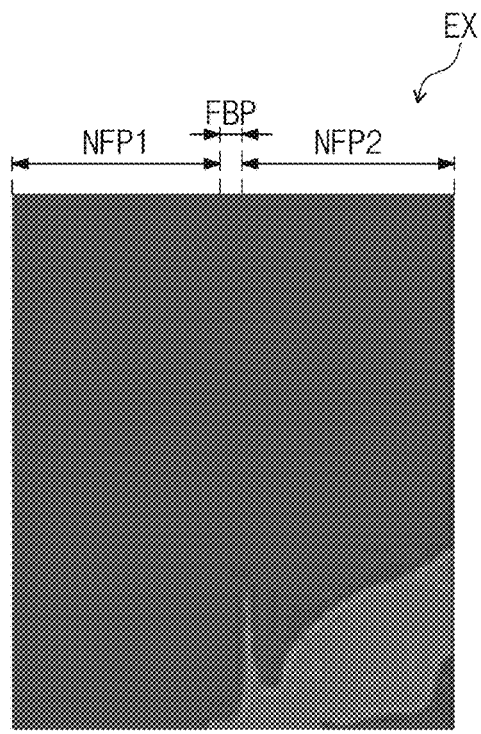
FIGS. 13A and 13B are images showing a portion of an electronic apparatus according to an embodiment of the inventive concepts.
Figure 13B:
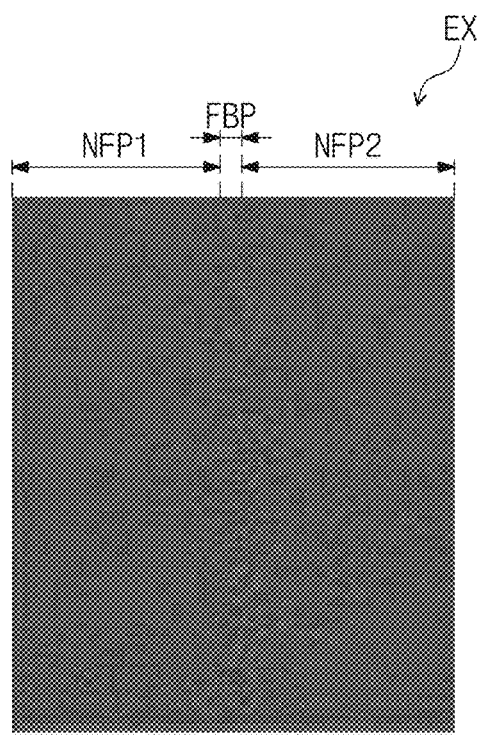

FIGS. 11A and 11B are images showing a portion of an electronic apparatus according to a comparative example of the inventive concepts. FIGS. 12A and 12B are images showing a portion of an electronic apparatus according to a comparative example of the inventive concepts. FIGS. 13A and 13B are images showing a portion of an electronic apparatus according to an embodiment of the inventive concepts. An electronic apparatus EX shown in FIGS. 13A and 13B may correspond to the electronic apparatus EA-1 illustrated in FIG. 10A.

FIGS. 11A to 13B are images showing degrees of deformation of insulating (e.g., encapsulation) layers 50 (see FIG. 2B) in color after fall experiments at the same height. The images show panel TFE principal strains. The principal strain may become lower as a color becomes closer to a blue color, and the principal strain may become higher as a color becomes closer to a red color. Hereinafter, the inventive concepts will be described with reference to FIGS. 11A to 13B.

A comparative example CM illustrated in FIGS. 11A and 11B may have a structure in which the impact absorbing member ABS, the second adhesive member A2, and the guide portion DM are omitted, as compared with the electronic apparatus EA-1 of FIG. 10A. As a result of the fall experiment of the comparative example CM, the principal strain of an area corresponding to the folding portion FBP is high. Here, the generated principal strain of the folding portion FBP is about 0.97%. According to the images of FIGS. 11A and 11B, it may be recognized that the folding portion FBP is greatly deformed by an external impact caused by the fall of the comparative example CM.

A comparative example CM1 illustrated in FIGS. 12A and 12B may have a structure in which the guide portion DM is omitted, as compared with the electronic apparatus EA-1 of FIG. 10A. In other words, the comparative example CM1 may further include the impact absorbing member ABS and the second adhesive member A2, as compared with the comparative example CM illustrated in FIGS. 11A and 11B.

As a result of the fall experiment of the comparative example CM1, the folding portion FBP is deformed. However, the principal strain of the folding portion FBP of the comparative example CM1 is lower than that of the folding portion FBP of the comparative example CM of FIGS. 11A and 11B. The principal strain of the folding portion FBP of the comparative example CM1 is about 0.57%. According to the images of FIGS. 12A and 12B, the degrees of deformation of the folding portion FBP and an area around the folding portion FBP may be somewhat reduced by the impact absorbing member ABS (see FIG. 10A), but some degree of the deformation may remain.

Referring to FIGS. 13A and 13B, it may be recognized that the folding portion FBP is hardly deformed in the electronic apparatus EX according to the embodiment of the inventive concepts, as compared with the comparative examples CM and CM1. The principal strain of the folding portion FBP of the electronic apparatus EX is about 0.10%. In other words, according to the embodiment of the inventive concepts, the electronic apparatus EA-1 may further include the guide portion DM, and thus damage of the display panel DP by an external impact may be prevented and the reliability of the electronic apparatus EA-1 may be improved.

According to the embodiments of the inventive concepts, even though laterally bent or twisted deformation occurs at the support unit of the electronic apparatus by an external impact, deformation of the display panel may be reduced or prevented. Thus, the reliability of the electronic apparatus may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An electronic apparatus comprising:
   a display panel comprising a folding portion overlapping with a folding axis of the display panel, a first non-folding portion, and a second non-folding portion, the first and second non-folding portions being spaced apart from each other with the folding portion interposed therebetween;
   a support unit comprising a first support portion overlapping with the first non-folding portion and a second support portion overlapping with the second non-folding portion and spaced apart from the first support portion;
   an impact absorbing member interposed between the display panel and the support unit and coupled to the display panel;
   an adhesive member interposed between the impact absorbing member and the support unit to couple the impact absorbing member and the support unit to each other;
   a receiving portion defined in at least one of the first support portion or the second support portion; and
   a protrusion connected to the impact absorbing member and arranged in the receiving portion,
   wherein the protrusion is less in planar area than that of the receiving portion.

2. The electronic apparatus of claim 1, wherein the adhesive member comprises a pressure sensitive adhesive (PSA).

3. The electronic apparatus of claim 1, wherein the protrusion has a circular shape when viewed in a plan view.

4. The electronic apparatus of claim 3, wherein the protrusion is spaced apart from an inner sidewall of the receiving portion.

5. The electronic apparatus of claim 1, wherein the protrusion has a bar shape extending in one direction when viewed in a plan view.

6. The electronic apparatus of claim 5, wherein the protrusion is in contact with an inner sidewall of the receiving portion in the one direction and is spaced apart from an inner sidewall of the receiving portion in another direction crossing the one direction.

7. The electronic apparatus of claim 1, further comprising:
   an elastic member arranged in the receiving portion and interposed between the protrusion and an inner sidewall of the receiving portion.

8. The electronic apparatus of claim 7, wherein the elastic member is higher in elastic force than that of the protrusion.

9. The electronic apparatus of claim 1, wherein the protrusion is connected directly to the impact absorbing member.

10. The electronic apparatus of claim 9, wherein the protrusion penetrates the adhesive member.

11. The electronic apparatus of claim 1, wherein the support unit further comprises a hinge portion overlapping with the folding portion and connecting the first support portion and the second support portion, and
   wherein the first support portion and the second support portion are foldable at the hinge portion.

12. The electronic apparatus of claim 11, wherein the adhesive member is spaced apart from the hinge portion when viewed in a plan view.

13. The electronic apparatus of claim 1, wherein the impact absorbing member is lower in elastic modulus than that of the support unit.

14. An electronic apparatus comprising:
- a display panel comprising a folding portion overlapping with a folding axis, a first non-folding portion, and a second non-folding portion, the first and second non-folding portions being spaced apart from each other with the folding portion interposed therebetween and each being connected to the folding portion;
- a support unit comprising a first support portion arranged under the first non-folding portion, and a second support portion arranged under the second non-folding portion and spaced apart from the first support portion;
- an impact absorbing member interposed between the display panel and the support unit and coupled to the display panel;
- an adhesive member interposed between the impact absorbing member and the support unit to couple the impact absorbing member and the support unit to each other; and
- a guide portion arranged on each of the first and second support portions,
- wherein the guide portion is spaced apart from the display panel and the adhesive member when viewed in a plan view.

15. The electronic apparatus of claim 14, wherein the guide portion has a bar shape facing an edge of the display panel and extending in a direction parallel to the edge, when viewed in a plan view.

16. The electronic apparatus of claim 14, wherein the guide portion has a shape which is spaced apart from a vertex of the display panel and is bent to surround two edges of the display panel, when viewed in a plan view.

17. The electronic apparatus of claim 14, wherein the guide portion is provided in plurality, and
   wherein the plurality of the guide portions are arranged along edges of the display panel.

18. The electronic apparatus of claim 14, wherein the support unit further comprises a hinge portion overlapping with the folding portion and connecting the first support portion and the second support portion, and
   wherein the adhesive member non-overlaps with the hinge portion when viewed in a plan view.

19. The electronic apparatus of claim 14, wherein the adhesive member comprises a pressure sensitive adhesive (PSA).

20. The electronic apparatus of claim 14, wherein the impact absorbing member is lower in elastic modulus than that of the support unit.

* * * * *